(12) United States Patent
Sagawa et al.

US008034672B2

(10) Patent No.: US 8,034,672 B2
(45) Date of Patent: Oct. 11, 2011

(54) METHOD OF PRODUCING DISPLAY DEVICE, DISPLAY DEVICE, METHOD OF PRODUCING THIN-FILM TRANSISTOR SUBSTRATE, AND THIN-FILM TRANSISTOR SUBSTRATE

(75) Inventors: Hiroshi Sagawa, Kanagawa (JP); Naobumi Toyomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 106 days.

(21) Appl. No.: 12/379,337

(22) Filed: Feb. 19, 2009

(65) Prior Publication Data

US 2009/0242884 A1    Oct. 1, 2009

(30) Foreign Application Priority Data

Mar. 25, 2008  (JP) ................................. 2008-077400
Dec. 19, 2008  (JP) ................................. 2008-323361

(51) Int. Cl.
*H01L 21/84* (2006.01)
(52) U.S. Cl. ........ 438/151; 438/158; 438/166; 438/487; 257/E21.414
(58) Field of Classification Search .................. 438/151, 438/158, 163, 164, 166, 486, 487; 257/E21.414
See application file for complete search history.

(56) References Cited

U.S. PATENT DOCUMENTS 6,723,590 B1 * 4/2004 Zhang et al. ................. 438/166
7,253,864 B2 * 8/2007 Kikuchi et al. .............. 349/144

FOREIGN PATENT DOCUMENTS

| JP | 2001-320055 | A | 11/2001 |
| JP | 2002-366057 | A | 12/2002 |
| JP | 2003-045890 | A | 2/2003 |
| JP | 2004-087620 | A | 3/2004 |
| JP | 2006-140462 | A | 6/2006 |
| JP | 2007-035964 | | 2/2007 |
| JP | 2008-033193 | A | 2/2008 |
| JP | 2008-033194 | A | 2/2008 |
| JP | 2009-109619 | A | 5/2009 |
| JP | 2009-122335 | A | 6/2009 |
| JP | 2009-122336 | A | 6/2009 |
| JP | 2009-128404 | A | 6/2009 |

OTHER PUBLICATIONS

Japanese Office Action issued Mar. 2, 2010 for corresponding Japanese Application No. 2008-323361.
Japanese Office Action issued Apr. 13, 2010 for corresponding Japanese Application No. 2008-101331.

* cited by examiner

*Primary Examiner* — Michael Trinh
(74) *Attorney, Agent, or Firm* — Rader, Fishman & Grauer PLLC

(57) ABSTRACT

A method of producing a display device includes the steps of forming gate electrodes on a substrate so that an arrangement of a source and a drain, in a pixel row direction, of a thin-film transistor formed in each of pixels on the substrate is reversed every pixel row; forming a gate insulating film and an amorphous semiconductor thin film on the substrate in that order so as to cover the gate electrodes; crystallizing the semiconductor thin film by irradiating the semiconductor thin film with an energy beam so that a scanning direction of the energy beam is the same with respect to the arrangement of the source and the drain in the pixel row direction; and forming a light-emitting element connected to the thin-film transistor.

9 Claims, 25 Drawing Sheets

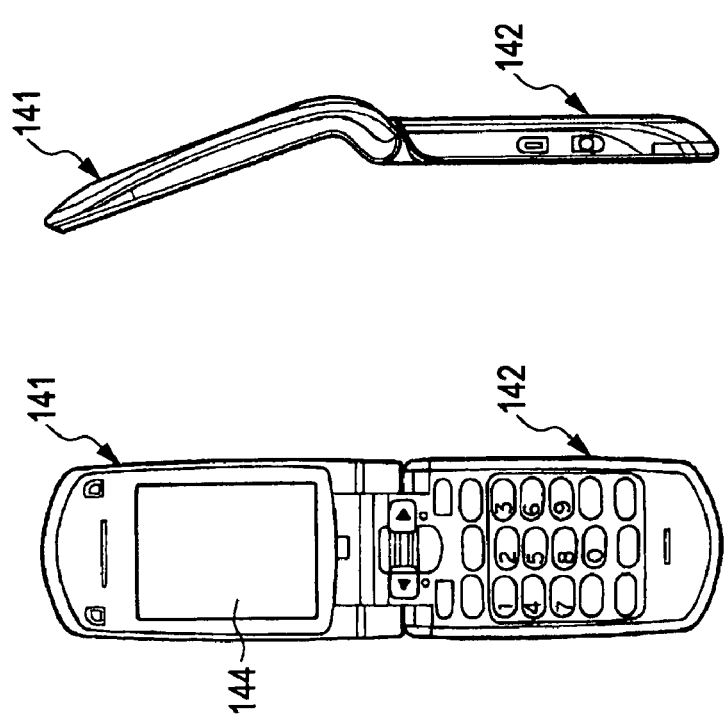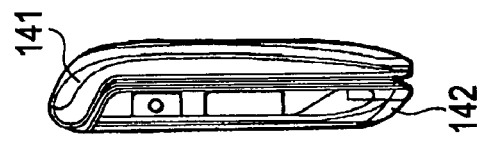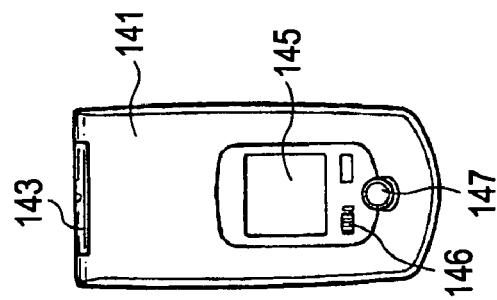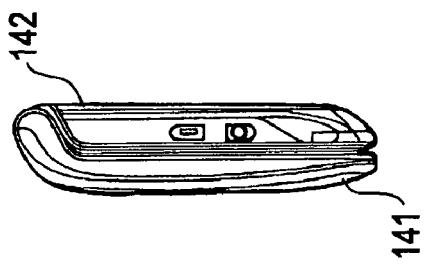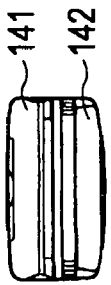

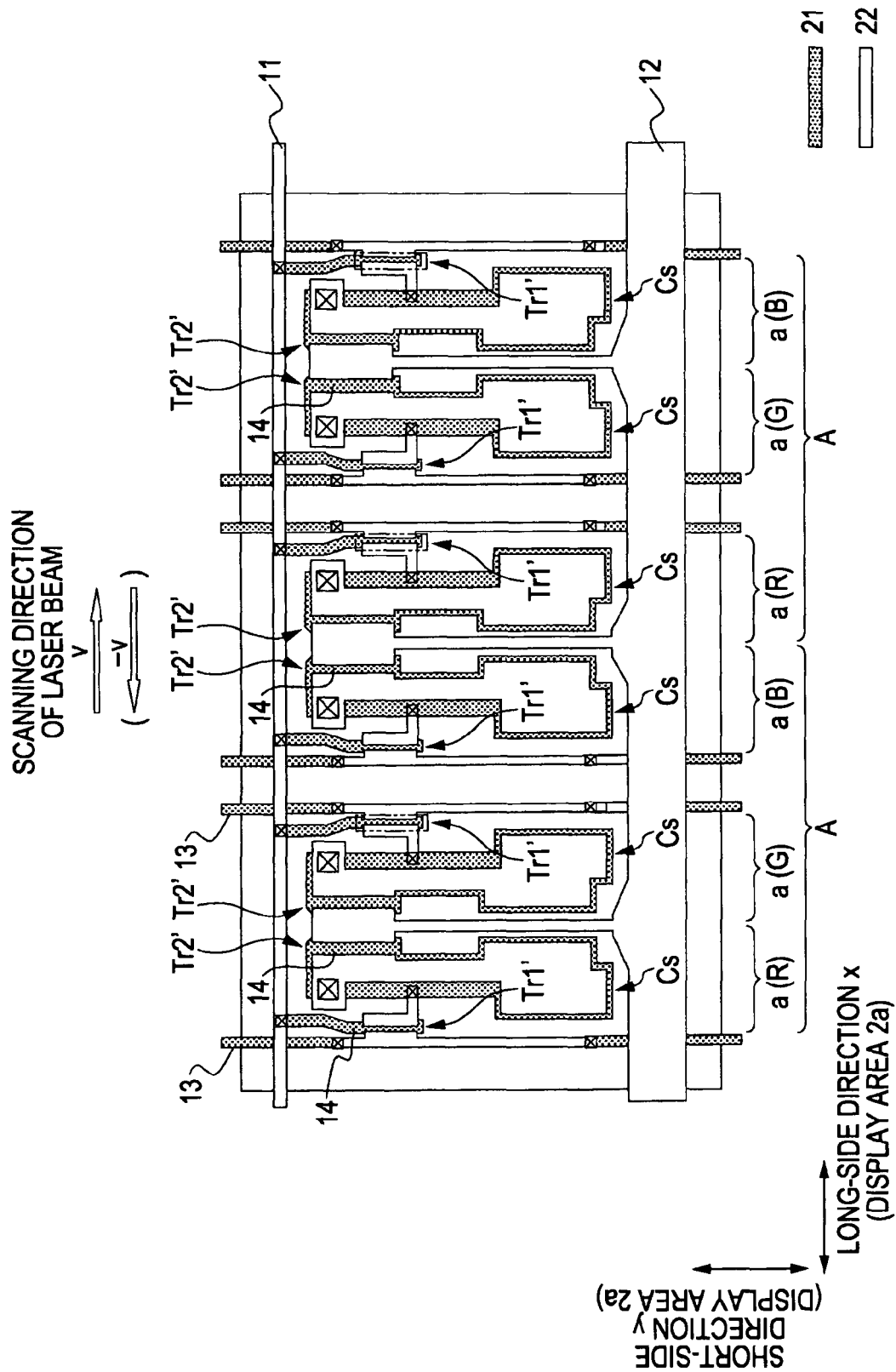

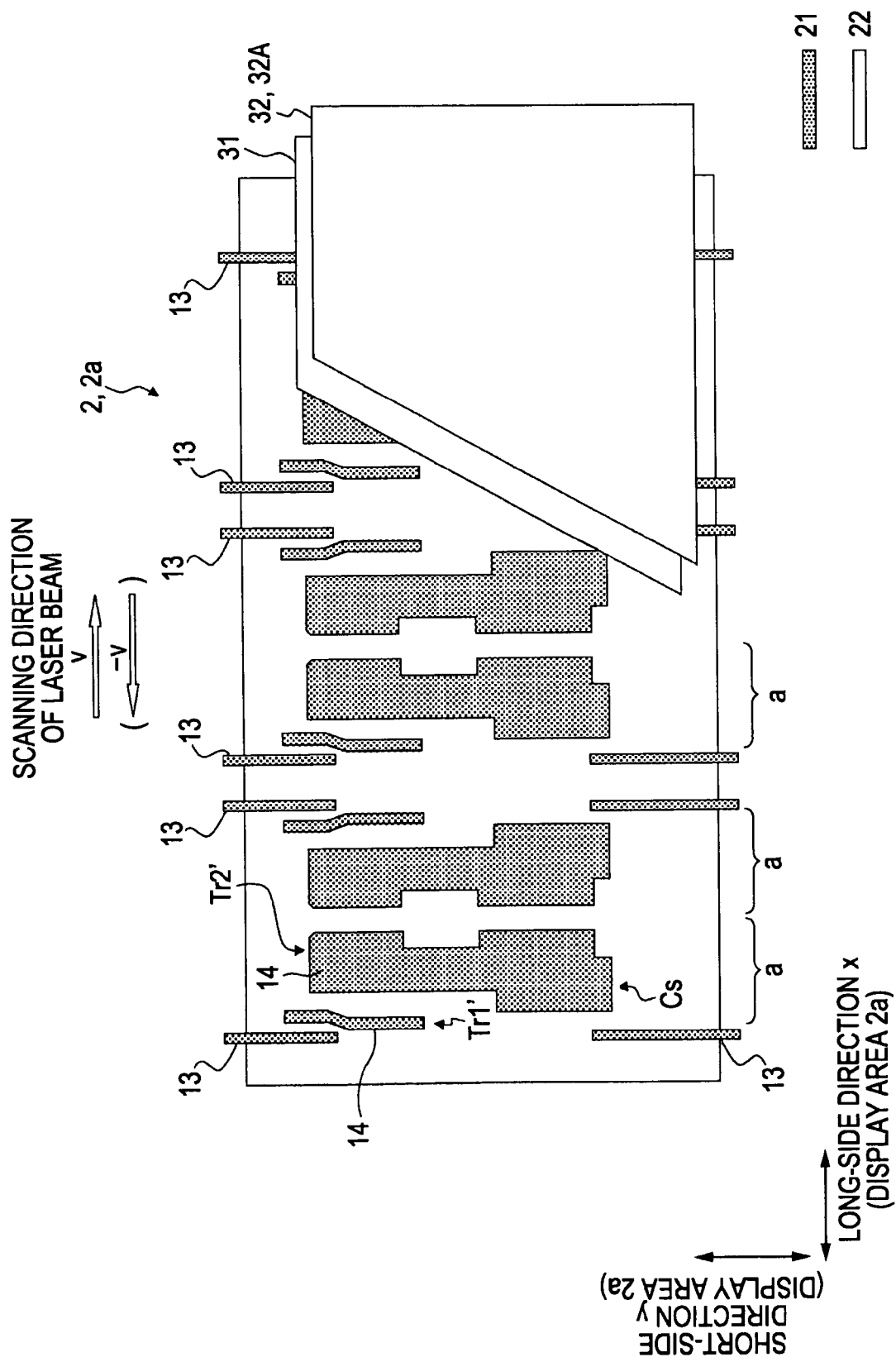

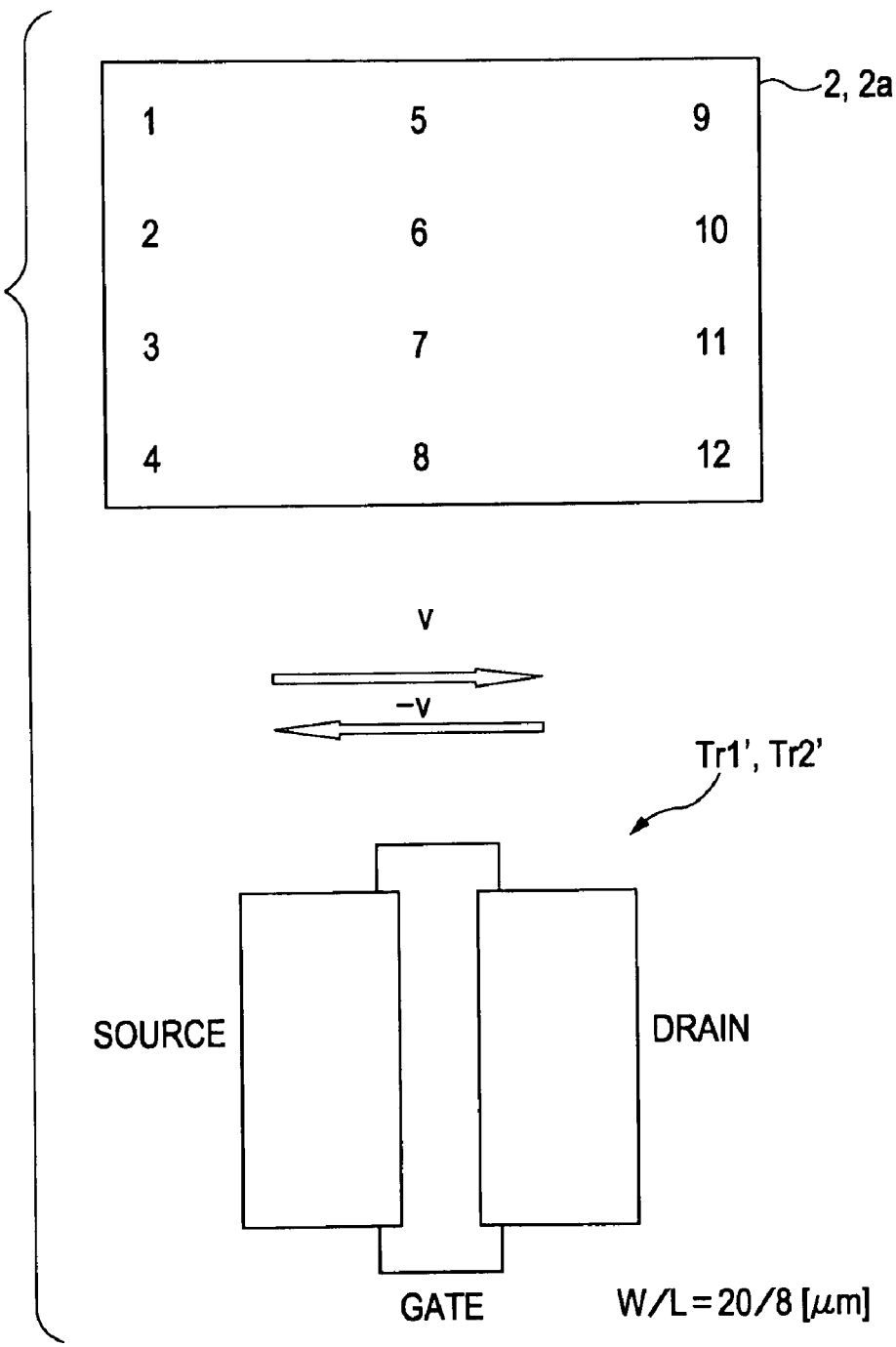

METHOD OF PRODUCING DISPLAY DEVICE, DISPLAY DEVICE, METHOD OF PRODUCING THIN-FILM TRANSISTOR SUBSTRATE, AND THIN-FILM TRANSISTOR SUBSTRATE

BACKGROUND OF THE INVENTION

1. Field of the Invention

The present invention relates to a method of producing a display device, a display device, a method of producing a thin-film transistor substrate, and a thin-film transistor substrate. In particular, the present invention relates to a method of producing an active matrix-driving display device including organic electroluminescent elements, the structure thereof, a method of producing a thin-film transistor substrate that is suitably used in the display device, and a thin-film transistor substrate.

2. Description of the Related Art

In an active matrix-driving display device in which organic electroluminescent elements and pixel circuits connected thereto are arranged on a substrate, the luminance of each of the organic electroluminescent elements is determined by the amount of current of a thin-film transistor (TFT) constituting the pixel circuit. Therefore, in order to obtain a display device in which uneven luminance is suppressed and which has satisfactory display properties, it is important that variation in properties of the thin-film transistor be suppressed.

In the case where a channel region of a thin-film transistor is formed of polycrystalline silicon, the size of crystal grains present in the channel region is nonuniform, and thus transistor characteristics readily vary. Consequently, as a method of microcrystallizing a semiconductor thin film constituting the channel region to the extent that the size of the crystal grains is not nonuniform, crystallization annealing, in which an amorphous thin film is microcrystallized using a solid-state laser, has been performed.

FIG. 23 shows an arrangement on a thin-film transistor substrate for illustrating a step of the above-mentioned crystallization annealing. FIG. 24 shows the arrangement of two display pixels in the thin-film transistor substrate. As shown in these figures, in a process of producing a medium or small size display panel, for example, two display panels 2 are arranged on a single glass substrate 1. In this case, a short side of each of the display panels 2 is arranged so as to be parallel to a long side of the glass substrate 1. In each of the display panels 2, a display area 2a having a shape that is substantially similar to the shape of the display panel 2 is defined. In each of the display areas 2a, sub-pixels a each having a rectangular shape in plan view are arranged. The sub-pixels a are arranged such that a long side of each of the sub-pixels a is parallel to a short-side direction y of the display area 2a. Furthermore, these sub-pixels a constitute substantially square display pixels A each composed of a set of three sub-pixels a of red (R), green (G), and blue (B), the three sub-pixels a being arranged in a direction of a short side of each of the sub-pixels a.

In the display area 2a in each of the display panels 2, scanning lines 11 and power lines 12 are arranged in a long-side direction x of the display area 2a, and signal lines 13 are arranged so as to be perpendicular to the scanning lines 11 and the power lines 12. The sub-pixels a are arranged so as to correspond to intersecting portions of these lines. In each of the sub-pixels a, thin-film transistors Tr1' and Tr2' each including a gate electrode 14 extending parallel to the signal lines 13, and a capacitive element Cs are arranged. In this case, by reversely disposing an arrangement of adjacent sub-pixels a, a part of the power line 12 can be shared, and thus a distance between wirings in a display pixel can be increased. As a result, short-circuit caused by, for example, a mixing of dust in a production process and generation of defects of the display pixel can be suppressed to improve the yield. In particular, a pixel circuit for diving an organic electroluminescent element includes a large number of elements, and thus it is important to increase the distance between wirings.

In order to make the above-described thin-film transistor substrate, the step of crystallization annealing is performed as follows. First, as shown in FIG. 25, gate electrodes 14 composed of a first metal pattern 21 are formed in each of display areas 2a on a glass substrate 1, and other wiring portions composed of the first metal pattern 21, such as parts of signal lines 13 and lower electrodes of capacitive elements Cs, are also formed at the same time. Next, a gate insulating film 31 and an amorphous semiconductor thin film 32 are formed in that order so as to cover the first metal pattern 21. Furthermore, a buffer layer and a photothermal conversion layer (not shown) are optionally formed thereon. Next, the semiconductor thin film 32 is irradiated with a laser beam through these layers while scanning the laser beam. Thereby, a semiconductor thin film 32 portion corresponding to a portion irradiated with the laser beam is microcrystallized to form a semiconductor thin film 32A.

In this case, a scanning direction v (−v) of the laser beam is parallel to the long-side direction x of the display area 2a. That is, as shown in FIG. 23, the scanning direction v (−v) of the laser beam is parallel to a short side of the substrate 1. Accordingly, variation in energy of a laser beam Lh due to a long scanning distance of the laser beam can be prevented, thereby forming more uniform crystals. In this case, in the example shown in FIG. 24, a channel length direction of each of the thin-film transistors Tr1' and Tr2' corresponds to the scanning direction v (−v) of the laser beam.

After the above-described step of crystallization annealing, as shown in the plan view of FIG. 26A and the cross-sectional view of FIG. 26B, the semiconductor thin film 32A, which has been microcrystallized, is patterned so as to have a shape covering the gate electrode 14. Furthermore, an etching stopper layer 33 is formed so as to overlap with the gate electrode 14. Note that FIG. 26B is a cross-sectional view taken along line XXVIB-XXVIB in FIG. 26A. Next, a source/drain 34sd (shown in only the cross-sectional view) composed of an n-type semiconductor thin film is formed so that the source/drain 34sd overlaps with the semiconductor thin film 32A and is separately disposed on the etching stopper layer 33. Subsequently, a source electrode/drain electrode 22sd composed of a second metal pattern 22 is further formed, thus obtaining the thin-film transistors Tr1' and Tr2'. Other wiring portions composed of the second metal pattern 22, for example, the scanning lines 11, the power lines 12, and upper electrodes of the capacitive elements Cs, all of which are shown in FIG. 24, are also formed together with the source electrode/drain electrode 22sd.

In the above-mentioned crystallization annealing using a solid-state laser, a thermal diffusion length when a heat quantity necessary for crystallizing a semiconductor thin film is supplied is longer than that in the case of crystallization annealing using an excimer laser. Accordingly, an effect of heat conduction by the gate electrode 14, which is provided under the semiconductor thin film 32, is significant, and thus crystallinity of the semiconductor thin film 32 is affected.

Consequently, the following structure has been proposed. As shown in FIG. 26, the gate electrode 14 of the thin-film transistors Tr1' and Tr2' is provided so as to extend in the channel length direction (i.e., the dimension of the gate electrode 14 is increased in a width direction), and the extending portions ΔLs and ΔLd are used as heat transfer components. According to this structure, in the step of crystallization annealing described above, the effect of heat conduction by the gate electrode 14 is made to be uniform in a channel region overlapping with the gate electrode 14. Consequently, uniform crystallinity of the channel region can be realized (see Japanese Unexamined Patent Application Publication No. 2007-35964).

SUMMARY OF THE INVENTION

Even when the dimension of the gate electrode 14 disposed under the semiconductor thin film 32 is increased in the line width direction as described with reference to FIG. 26, the crystallinity of the semiconductor thin film above the gate electrode 14 is varied depending on a scanning direction of a laser beam. More specifically, in the case where the line width direction (i.e., channel length direction) of the gate electrode 14 is the scanning direction of the laser beam, the gate electrode 14 is not readily thermally saturated at the upstream side of the scanning direction, whereas the gate electrode 14 is readily thermally saturated at the downstream side of the scanning direction.

Therefore, at the upstream side of the scanning direction v (−v) of the laser beam with respect to the gate electrode 14, crystallization of the semiconductor thin film 32 tends to be performed before the gate electrode 14 is sufficiently heated by the irradiation of the laser beam. Consequently, crystallinity at the upstream side is low. In contrast, at the downstream side of the scanning direction v (−v) of the laser beam with respect to the gate electrode 14, crystallization of the semiconductor thin film 32 is performed after the gate electrode 14 is sufficiently heated by the irradiation of the laser beam. Consequently, crystallinity at the downstream side is high.

Accordingly, in the thin-film transistors Tr1' and Tr2' arranged as shown in FIG. 24, a portion having low crystallinity and a portion having high crystallinity are formed at ends in a channel length direction in the channel region of the semiconductor thin film. Such variation in crystallinity in the channel length direction in the channel region significantly affects an on-current of the thin-film transistors. Table 1 shows values of an on-current of thin-film transistors formed positions 1 to 12 (see FIG. 27) in the case where the scanning direction v (v) of the laser beam during crystallization annealing is changed. In one case, the source side of each of the thin-film transistors Tr1' and Tr2' is upstream of the scanning direction. In another case, the drain side thereof is upstream of the scanning direction. As shown in FIG. 27, the values of the on-current are values for the thin-film transistors formed at positions 1 to 12 separately disposed on a display panel 2 of a substrate. The ratio W/L of a gate width W to a gate length L of each of the thin-film transistors is 20/8.

TABLE 1

| Position | Scanning direction of laser beam | |
|---|---|---|
| | Upstream: source side | Upstream: drain side |
| | On-current value | |
| 1 | 2.35E−06 | 2.61E−06 |
| 2 | 2.33E−06 | 2.59E−06 |
| 3 | 1.98E−06 | 2.17E−06 |
| 4 | 1.87E−06 | 2.03E−06 |
| 5 | 2.48E−06 | 2.70E−06 |
| 6 | 2.51E−06 | 2.71E−06 |
| 7 | 2.20E−06 | 2.40E−06 |
| 8 | 2.06E−06 | 2.23E−06 |
| 9 | 2.59E−06 | 2.77E−06 |
| 10 | 2.63E−06 | 2.66E−06 |
| 11 | 2.40E−06 | 2.47E−06 |
| 12 | 1.94E−06 | 2.08E−06 |

$V_g = 10\,V$, $V_d = 10\,V$

As is apparent from Table 1, when a side at which crystallinity is low (i.e., the upstream side of the scanning direction) is a drain, the on-current is large. In contrast, when the side at which crystallinity is low (i.e., the upstream side of the scanning direction) is a source, the on-current is small.

Accordingly, in the case where adjacent sub-pixels a are reversely arranged as shown in FIG. 24, the arrangements of the thin-film transistors Tr1' and Tr2' of sub-pixels a for the same color in adjacent display pixels are reversed. Therefore, in the thin-film transistors Tr1' and Tr2' of the sub-pixels a for the same color, a transistor characteristic, e.g., the on-current, is varied because of the above-described variation in crystallinity at ends in the channel length direction. Accordingly, in the sub-pixels a for the same color in the adjacent display pixels, a difference in the luminance between light-emitting elements each connected to the thin-film transistors Tr1' and Tr2' is generated. As a result, the difference in the luminance between the adjacent display pixels is visually recognized as uneven luminance.

Alternatively, for example, in order to reduce the time necessary for the step of crystallization annealing, laser irradiation is performed in a scanning direction v for a first sub-pixel a row, and laser irradiation is then performed in a scanning direction −v for a second sub-pixel a row. That is, in a reciprocating scanning of a laser beam, laser irradiation is performed for sub-pixels a arranged in different rows. In such a case, a difference in a characteristic of thin-film transistors is generated every row, resulting in a difference in the luminance between light-emitting elements connected to the thin-film transistors.

It is desirable to provide a method of producing a display device having good display properties, by which thin-film transistors in which on-currents are uniform can be obtained, and thus uneven luminance of light-emitting elements connected to the thin-film transistors can be prevented, while decreasing the time necessary for a step of crystallization annealing of a semiconductor thin film. Furthermore, it is desirable to provide a display device produced by the method.

A method of producing a display device and a method of producing a thin-film transistor substrate according to an embodiment of the present invention include the following steps. First, gate electrodes are formed on a substrate so that an arrangement of a source and a drain, in a pixel row direction, of a thin-film transistor formed in each of pixels on the substrate is reversed every pixel row. Next, a gate insulating film and an amorphous semiconductor thin film are formed on the substrate in that order so as to cover the gate electrodes. Subsequently, the semiconductor thin film is crystallized by irradiating the semiconductor thin film disposed above the gate electrodes with an energy beam so that a scanning direction of the energy beam is the same with respect to the arrangement of the source and the drain in the pixel row direction while scanning the energy beam. In producing the display device, a light-emitting element connected to the thin-film transistor thus formed is further formed.

Embodiments of the present invention also provide a display device in which thin-film transistors obtained by the above production method are connected to light-emitting elements, and a thin-film transistor substrate. The display device according to an embodiment of the present invention includes first pixel rows each including thin-film transistors each having a source and a drain arranged in a first direction, second pixel rows each including thin-film transistors each having a source and a drain arranged in a second direction opposite to the first direction, and a plurality of light-emitting elements connected to the thin-film transistors.

In the method according to an embodiment of the present invention, in crystallization of the semiconductor thin film by irradiation of an energy beam, the energy beam is scanned so that a scanning direction is the same with respect to the arrangement of the source and the drain in the pixel row direction. Accordingly, portions of the semiconductor thin film disposed above the gate electrodes are constantly scanned by the energy beam in a direction from a drain side to a source side (or in the reverse direction). Therefore, a difference in crystallinity between a portion of the semiconductor thin film at the source side and a portion of the semiconductor thin film at the drain side, the difference being caused by a difference in the scanning direction of the energy beam with respect to the gate electrodes, is constant in the thin-film transistors. In addition, the gate electrodes are formed so that the arrangement of the source and the drain in the pixel row direction is reversed every pixel row. Therefore, in order to scan the energy beam so that the scanning direction is the same with respect to the arrangement of the source and the drain in the pixel row direction as described above, both the plus direction and the minus direction of the pixel row direction are necessary as the scanning direction. Accordingly, scanning of the energy beam is performed in the pixel row direction in a reciprocating manner.

As described above, according to an embodiment of the present invention, by performing a reciprocating scanning of an energy beam in the pixel row direction, the time necessary for the step of crystallization annealing of the semiconductor thin film can be reduced. In addition, a difference in crystallinity between a portion of the semiconductor thin film at the source side and a portion of the semiconductor thin film at the drain side, the difference being caused by a difference in the scanning direction of the energy beam, is constant in the thin-film transistors. Consequently, thin-film transistors in which the on-current is uniform can be produced. As a result, a display device which has satisfactory display properties and in which uneven luminance of light-emitting elements connected to thin-film transistors is prevented can be produced within a further reduced turn-around time (TAT).

BRIEF DESCRIPTION OF THE DRAWINGS

FIGS. 22A to 22G are views showing a mobile terminal device, e.g., a mobile phone, to which an embodiment of the present invention is applied;

FIG. 24 is a view showing an arrangement of two display pixels illustrating the step of crystallization annealing in producing the display device in the related art;

FIG. 25 is a plan view of the two display pixels illustrating a step in a process of producing the display device in the related art;

FIG. 27 includes views illustrating positions on a substrate used for measuring values of an on-current and scanning directions of a laser beam for thin-film transistors.

DESCRIPTION OF THE PREFERRED EMBODIMENTS

Figure 1:
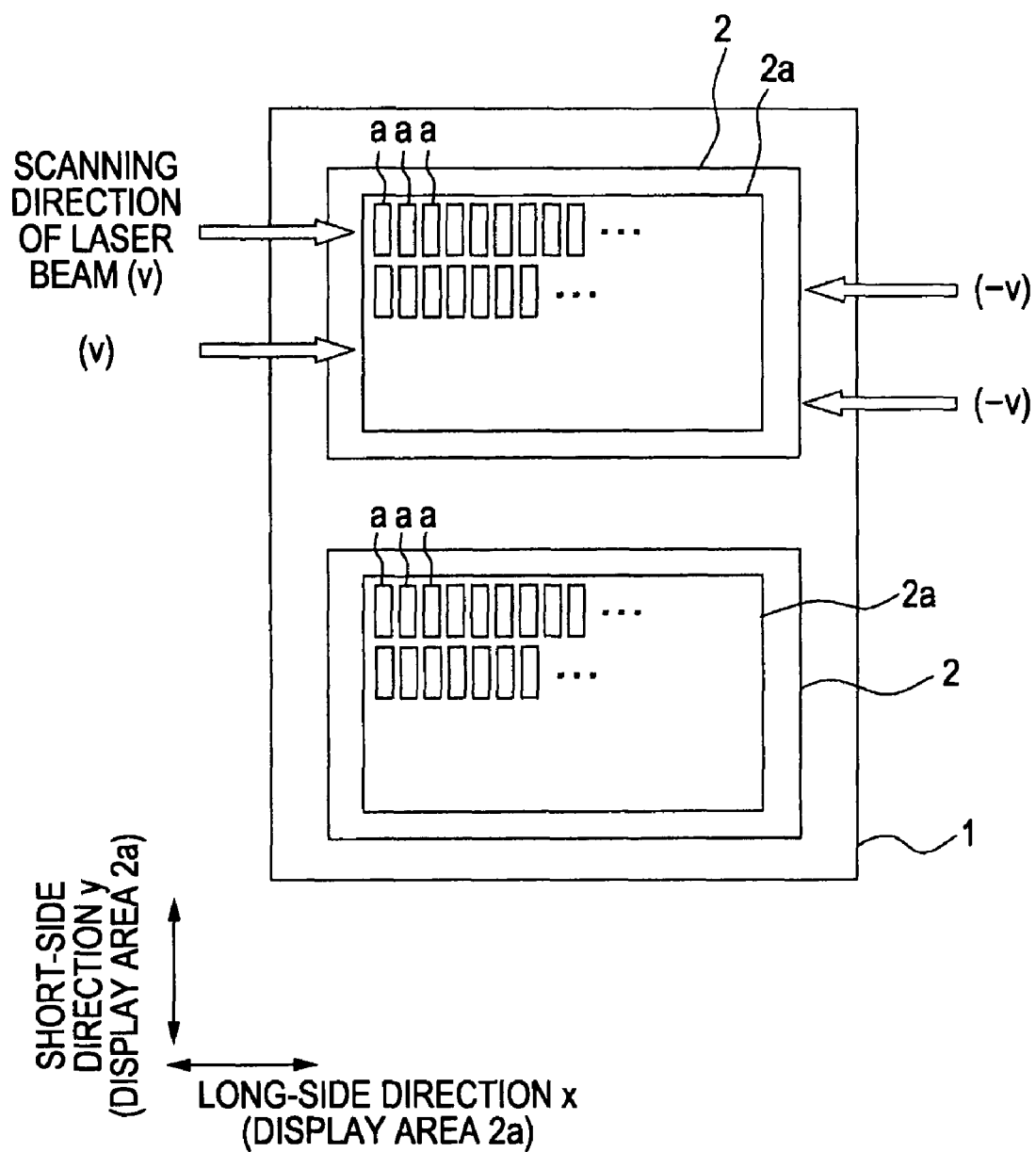
FIG. 1 is a view showing an arrangement on a substrate illustrating a first embodiment.

Embodiments in which the present invention is applied to an active matrix display device including thin-film transistors and organic electroluminescent elements connected to the thin-film transistors will now be described in detail with reference to the drawings. The embodiments will be described in the following order.

1. First embodiment (An example in which a source/drain arrangement of a thin-film transistor for driving is reversed every pixel row and two pixel rows share a power line)

2. Second embodiment (An example in which a source/drain arrangement of a thin-film transistor for driving is reversed every pixel row)
3. Third first embodiment (An example in which a source/drain arrangement of each of a thin-film transistor for driving and a thin-film transistor for switching is reversed every pixel row and two pixel rows share a power line)
4. Fourth embodiment (An example in which pixel rows in which a source/drain arrangement is reversed are separately arranged in two areas in a display area)
5. Fifth embodiment (An example in which pixel circuits of only blue sub-pixels among sub-pixels arranged in a pixel row direction are reversed)

In each of the embodiments, a procedure of producing an active matrix display device wherein light-emitting elements are connected to thin-film transistors will be sequentially described from a process of producing a thin-film transistor substrate. In the description, the same components as those in the structure in the related art described with reference to FIGS. 23 to 26 are assigned the same reference numerals and symbols.

First Embodiment

An arrangement on a thin-film transistor substrate for carrying out a production method of a first embodiment will now be described with reference to FIGS. 1 and 2. For reference, a circuit diagram of each sub-pixel is shown in FIG. 3.

As shown in FIG. 1, a glass substrate 1 having a rectangular shape in plan view is prepared. Next, areas for forming, for example, two display panels 2 are defined on the glass substrate 1. In this step, a short side of each of the display panels 2 is arranged so as to parallel to a long side of the glass substrate 1 so that the two display panels 2 can be efficiently arranged on the single glass substrate 1. In each of the display panels 2, a display area 2a having a rectangular shape in plan view that is substantially similar to the shape of the display panel 2 is defined. In each of the display areas 2a, sub-pixels a each having a rectangular shape in plan view are arranged. These sub-pixels a are arranged such that a long side of each of the sub-pixels a is parallel to a short-side direction y of the display area 2a. Furthermore, these sub-pixels a constitute substantially square display pixels each composed of a set of three sub-pixels, namely, a red (R) sub-pixel a(R), a green (G) sub-pixel a(G), and a blue (B) sub-pixel a(B), the three sub-pixels a being arranged in a direction of a short side of each of the sub-pixels a. This arrangement is the same as that in the related art.

Figure 2:
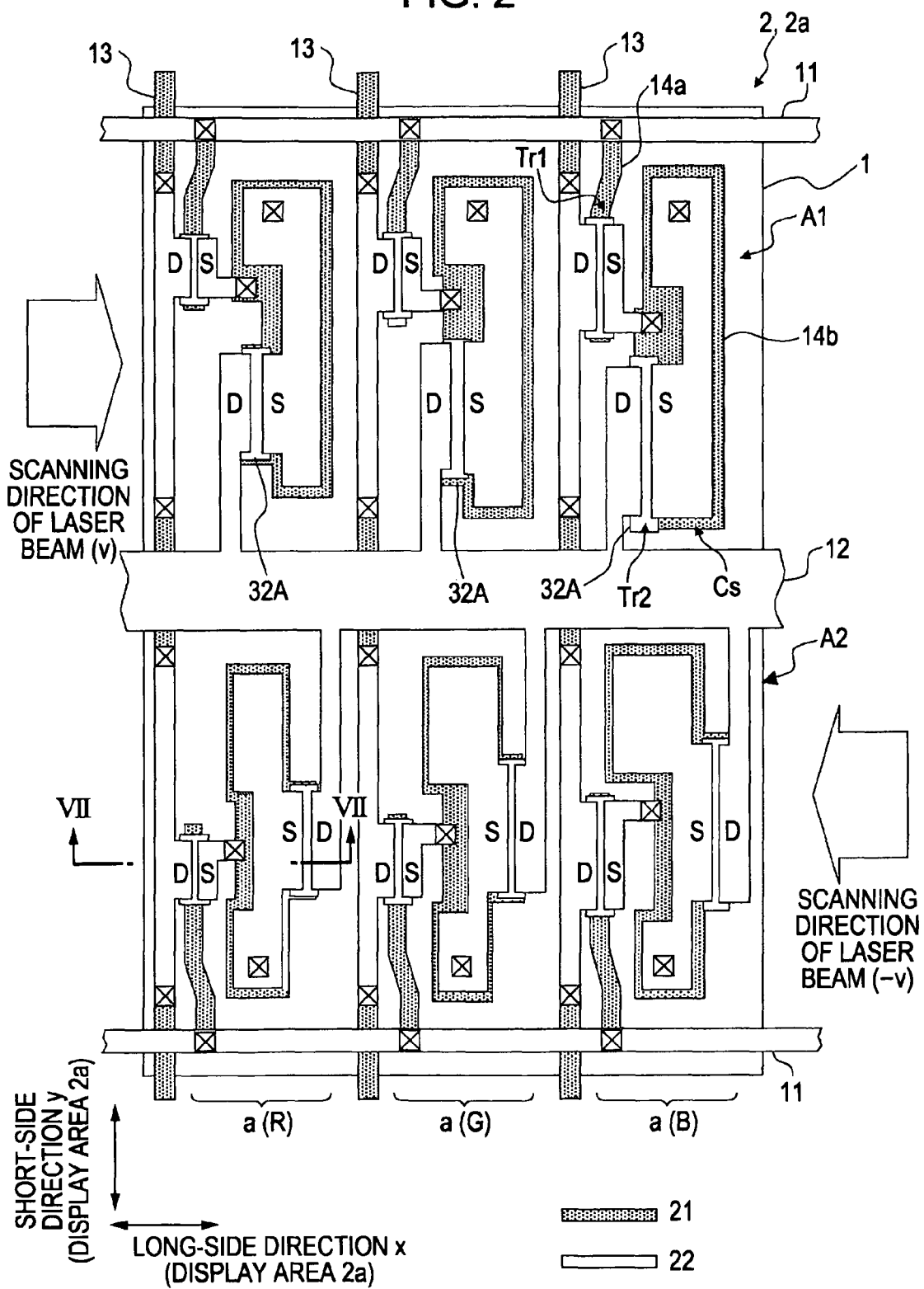
FIG. 2 is a view showing an arrangement of six pixels (sub-pixels) illustrating the first embodiment.
Figure 3:
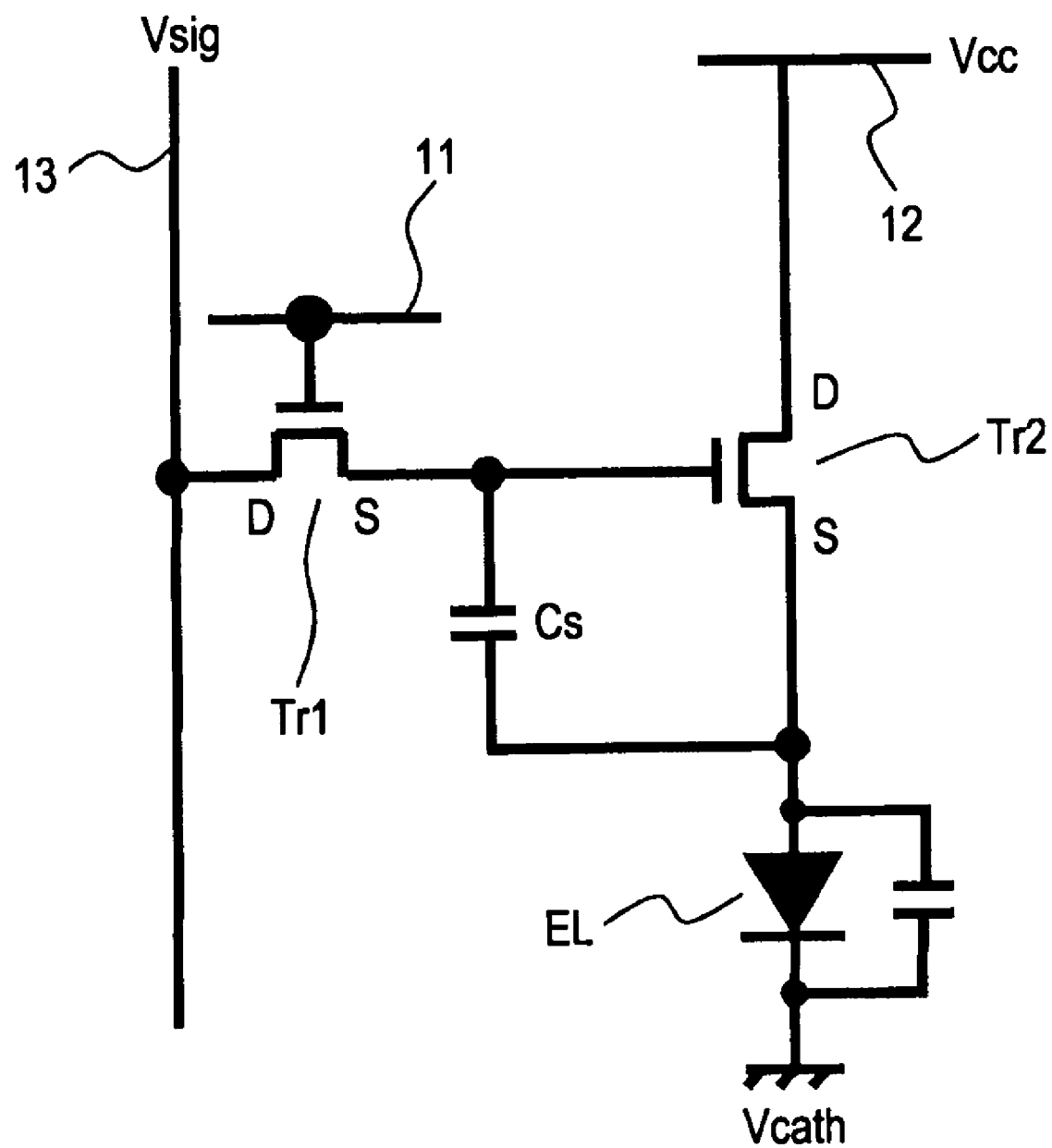
FIG. 3 is a circuit diagram of each of the sub-pixels.

As shown in FIG. 2, in each of the display areas 2a, scanning lines 11 and power lines 12 are arranged in a long-side direction x of the display area 2a, and signal lines 13 are arranged so as to be perpendicular to the scanning lines 11 and the power lines 12. In this embodiment, in particular, a power line 12 is disposed between two scanning lines 11. The sub-pixels a are arranged so as to correspond to intersecting portions of these scanning lines 11 and power lines 12, and the signal lines 13.

In each of the sub-pixels a, a thin-film transistor for switching (hereinafter referred to as a "switching transistor") Tr1 and a thin-film transistor for driving (hereinafter referred to as a "driving transistor") Tr2, and a capacitive element Cs are arranged (see FIG. 3), and these transistors and the capacitive element Cs constitute a pixel-driving circuit. In the switching transistor Tr1, a gate electrode is connected to a scanning line 11, a drain D is connected to a signal line 13, and a source S is connected to the capacitive element Cs and the driving transistor Tr2. In the driving transistor Tr2, a gate electrode is connected to the capacitive element Cs and the switching transistor Tr1, a drain D is connected to a power line 12, and a source S is connected to an electroluminescent element EL.

In each pixel-driving circuit having the above structure, a picture signal written from the signal line 13 through the switching transistor Tr1 selected in the scanning line 11 is held in the storage capacitor Cs. A current corresponding to the amount of held signal is supplied from the source S of the driving transistor Tr2 to the electroluminescent element EL. The electroluminescent element EL emits light with a luminance corresponding to the value of this current.

Each of electroluminescent elements EL provided in sub-pixels a(R), a(G), and a(B) emits light with a luminance corresponding to the current value of the corresponding driving transistor Tr2. Therefore, the driving transistors Tr2 provided in the sub-pixels a(R), a(G), and a(B) have channel widths that are different depending on the luminous efficiency of the electroluminescent elements EL for each color provided in the sub-pixels. More specifically, in a sub-pixel including an electroluminescent element EL for a color with a low luminous efficiency, the channel width of the driving transistor Tr2 is determined to be large. Here, for example, it is assumed that the luminous efficiency of a blue electroluminescent element EL is the lowest and the channel width of the driving transistor Tr2 in the blue sub-pixel a(B) is the largest, the channel width of the driving transistor Tr2 in the green sub-pixel a(G) is the second largest, and the channel width of the driving transistor Tr2 in the red sub-pixel a(R) is the smallest.

In each of the sub-pixels a, the thin-film transistors Tr1 and Tr2 are arranged as bottom-gate thin-film transistors. These thin-film transistors Tr1 and Tr2 are arranged so that a channel length direction thereof is parallel to a short side of the sub-pixel a, that is, gate electrodes 14a and 14b extend in a long-side direction of the sub-pixel a, i.e., in the short-side direction y of the display area 2a.

Furthermore, in particular, when a row of sub-pixels a parallel to a scanning line 11 is defined as a pixel row, in each of the display areas 2a, first pixel rows A1 and second pixel rows A2 are arranged in accordance with a source S/drain D arrangement of the driving transistor Tr2. In the first pixel rows A1 and the second pixel rows A2, the source S and the drain D of the driving transistor Tr2 are reversely arranged with respect to the direction of the pixel rows. More specifically, in each of sub-pixels a in the first pixel rows A1, the drain D and the source S of the driving transistor Tr2 are arranged in that order in a first direction (for example, in a direction from the left to the right in FIG. 2). In contrast, in each of sub-pixels a in the second pixel rows A2, the drain D and the source S of the driving transistor Tr2 are arranged in that order in a second direction opposite to the first direction (for example, in a direction from the right to the left in FIG. 2).

Preferably, the first pixel rows A1 and the second pixel rows A2 are alternately arranged so as to be adjacent to each other along the extending direction of the signal lines 13. The driving transistors Tr2 arranged in a first pixel row A1 and the driving transistors Tr2 arranged in a second pixel row A2, the first pixel row A1 and the second pixel row A2 being alternately arranged, share a power line 12.

A thin-film transistor substrate having the above-described arrangement is prepared by the following procedure.

Figure 4:
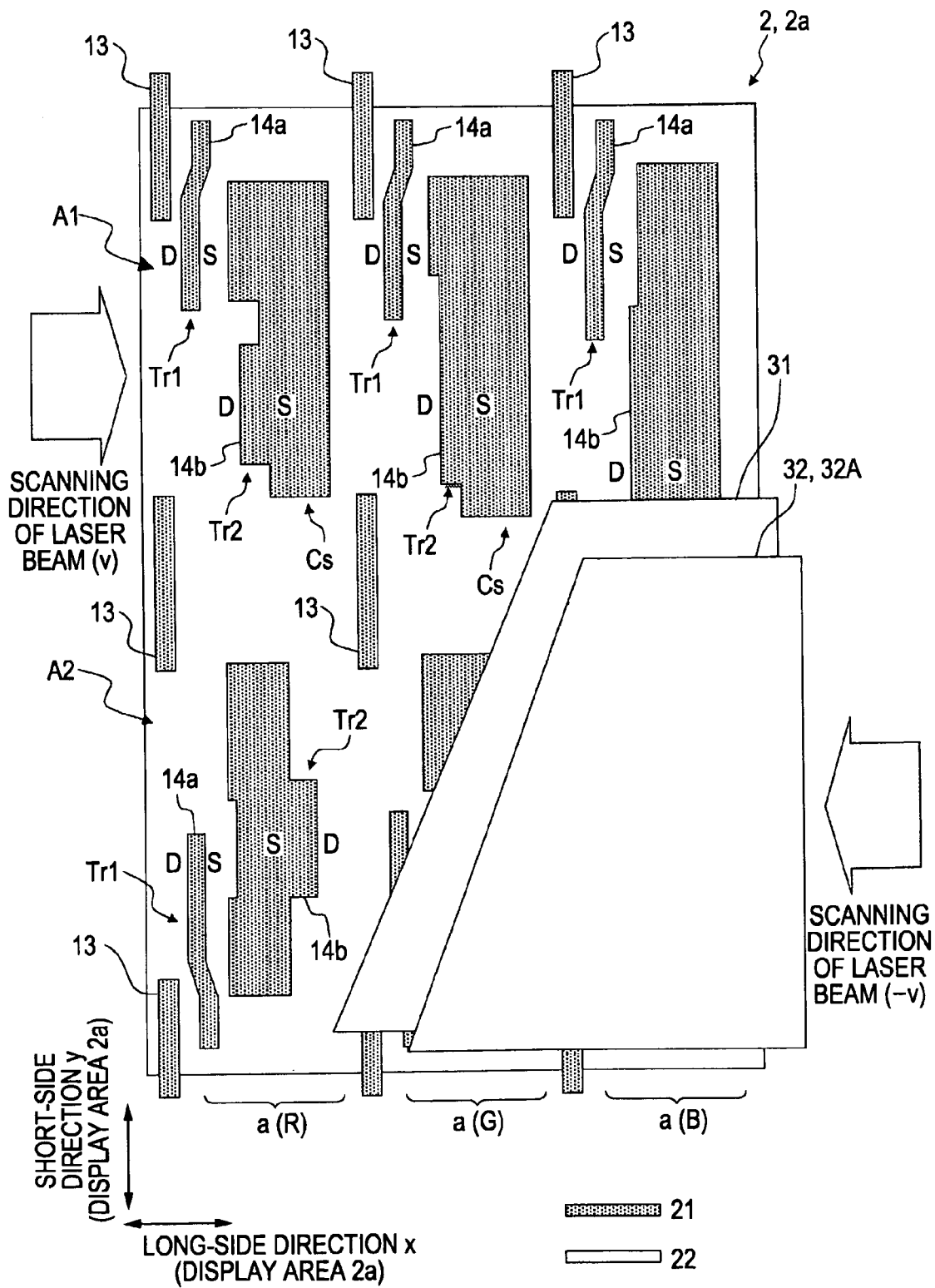
FIG. 4 is a plan view of the six pixels (sub-pixels) illustrating a step in a production process of the first embodiment.
Figure 5A:
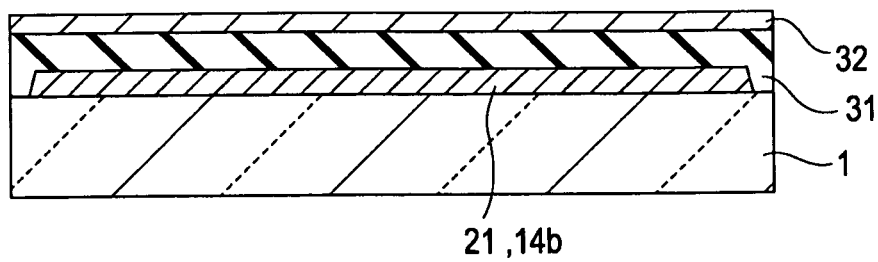
FIGS. 5A to 5D are cross-sectional views (part 1) illustrating the production process of the first embodiment.

First, as shown in the plan view of FIG. 4 and the cross-sectional view of FIG. 5A (corresponding to a cross-sectional view taken along line VII-VII in the plan view of FIG. 2), gate electrodes 14a and 14b composed of a first metal pattern 21 are formed on each of display areas 2a of a glass substrate 1, and furthermore, other wiring portions composed of the first metal pattern 21, for example, parts of signal lines 13 and lower electrodes of capacitive elements Cs, are also formed. In this step, the gate electrodes 14a of switching transistors Tr1 and the gate electrodes 14b of driving transistors Tr2 are patterned so as to extend in a direction parallel to a short-side direction y of the display area 2a. The parts of the signal lines 13 are patterned so as to extend in the direction parallel to the short-side direction y of the display area 2a.

In particular, the gate electrodes 14b of the driving transistors Tr2 are provided such that a source S/drain D arrangement in an arrangement direction of sub-pixels a is reversed every pixel row extending in a direction perpendicular to an extending direction of the signal lines 13. More specifically, in each of the display areas 2a, first pixel rows A1 and second pixel rows A2 are arranged in accordance with the source S/drain D arrangement of the driving transistors Tr2. In the first pixel rows A1 and the second pixel rows A2, the source S/drain D arrangement of the driving transistors Tr2 is reversed in the arrangement direction of the sub-pixels a. The gate electrode 14b of the driving transistor Tr2 is formed as a pattern that is continuous with the lower electrode of the capacitive element Cs. A portion constituting the gate electrode 14b in this continuous pattern is provided so as to extend in a direction parallel to the short-side direction y of the display area 2a.

The first metal pattern 21 including the gate electrodes 14a and 14b is formed by, for example, depositing a molybdenum (Mo) film by a sputtering method, and then pattern-etching the molybdenum (Mo) film using a resist pattern as a mask. The material of the first metal pattern 21 is not limited to molybdenum (Mo) as long as the material is a refractory metal that is not readily degraded in a subsequent heating step.

Next, a gate insulating film 31 made of, for example, silicon oxide or silicon nitride is deposited so as to cover the first metal pattern 21, and a semiconductor thin film 32 made of amorphous silicon is subsequently deposited on the gate insulating film 31.

Figure 5B:
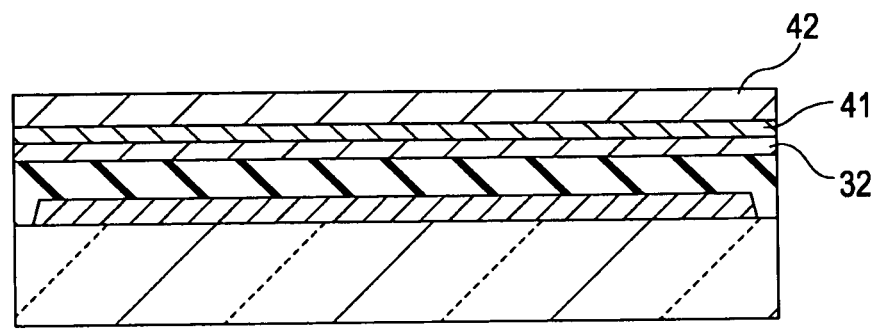

Subsequently, as shown in FIG. 5B, a buffer layer 41 made of silicon oxide or silicon nitride is deposited so as to cover the semiconductor thin film 32. Subsequently, a photothermal conversion layer 42 made of molybdenum (Mo) is deposited on the buffer layer 41. This photothermal conversion layer 42 is a layer for absorbing an energy beam such as a laser beam described below and converting light energy to heat energy. Accordingly, any material may be used as the photothermal conversion layer 42 as long as the material satisfies the conditions that, for example, the absorption rate of a laser beam (energy beam) used in crystallization annealing in the subsequent step is high, thermal diffusion rates to the buffer layer 41 and the semiconductor thin film 32 are low, and the material has a high melting point so as not to be readily degraded by heat generated in the subsequent crystallization. Alternatively, for example, carbon (C) may be used.

Figure 5C:
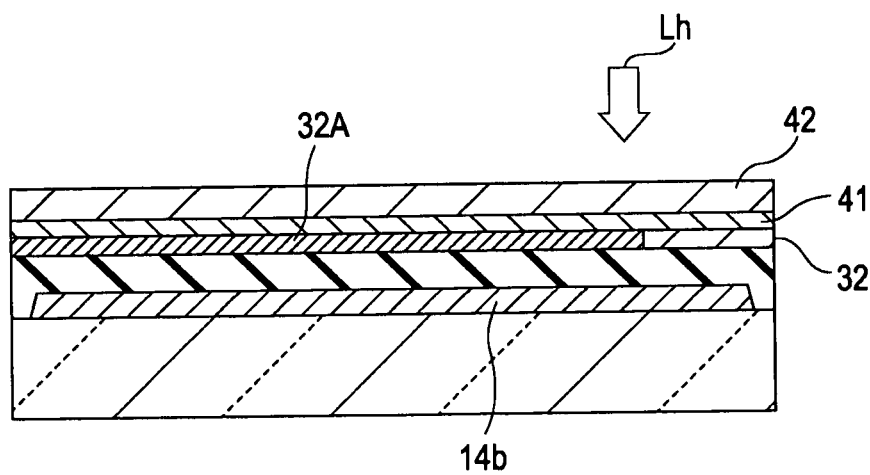

Subsequently, as shown in FIG. 5C and the plan view of FIG. 4, the semiconductor thin film 32 is indirectly irradiated with a laser beam Lh through the photothermal conversion layer 42 and the buffer layer 41, thus performing a heat treatment on the semiconductor thin film 32. In this step, a laser beam emitted from an oscillation source composed of a solid-state laser is irradiated as the laser beam Lh. Consequently, a portion of the semiconductor thin film 32, the portion being irradiated with the laser beam Lh, is formed into a microcrystalline silicon thin film 32A (semiconductor thin film 32A) crystallized so as to have crystal grains on the nanometer order.

In the irradiation of the laser beam Lh in this step, it is important that the semiconductor thin film 32 disposed above the gate electrode 14b be irradiated with the laser beam Lh while scanning the laser beam Lh such that a scanning direction of the laser beam Lh is the same with respect to the arrangement of the source S and the drain D in a direction of a row of the sub-pixels a (i.e., here, in a direction perpendicular to the signal lines 13).

For this purpose, in this step, the scanning direction v (−v) of the laser beam Lh with respect to the arrangement direction of the sub-pixels a is reversed between the first pixel rows A1 and the second pixel rows A2. Specifically, for the first pixel rows A1, the semiconductor thin film 32 is irradiated with the laser beam Lh in a scanning direction v (−v) of the laser beam Lh. In contrast, for the second pixel rows A2, the semiconductor thin film 32 is irradiated with the laser beam Lh in a scanning direction −v (v) of the laser beam Lh. In particular, the scanning direction v (−v) of the laser beam Lh is preferably determined so that the source S side of the driving transistor Tr2 is downstream and the drain D side thereof is upstream. Accordingly, the semiconductor thin film 32 is preferably irradiated with the laser beam Lh in the scanning direction v for the first pixel rows A1 and in the scanning direction −v for the second pixel rows A2. Consequently, each of the display area 2a can be irradiated with the laser beam Lh while scanning the laser beam Lh in the long-side direction x of the display area 2a in a reciprocating manner.

In addition, the first pixel rows A1 and the second pixel rows A2 are alternately arranged along the extending direction of the signal lines 13. Therefore, in the scanning of the laser beam Lh in the reciprocating manner, it is sufficient that the laser beam Lh is moved to an adjacent pixel row at an end in the scanning direction v (−v) of the laser beam Lh, and thus a moving distance can be minimized.

An irradiation width in a direction perpendicular to the scanning direction v (−v) of the laser beam Lh is determined so as to substantially cover portions where the transistors Tr1 and Tr2 are formed. In this step, it is sufficient that only portions corresponding to positions where the thin-film transistors Tr1 and Tr2 arranged as described with reference to FIG. 2 are formed are selectively irradiated with the laser beam Lh. That is, it is sufficient that only areas including upper portions of the gate electrodes (14a) 14b are selectively irradiated with the laser beam Lh.

Figure 5D:
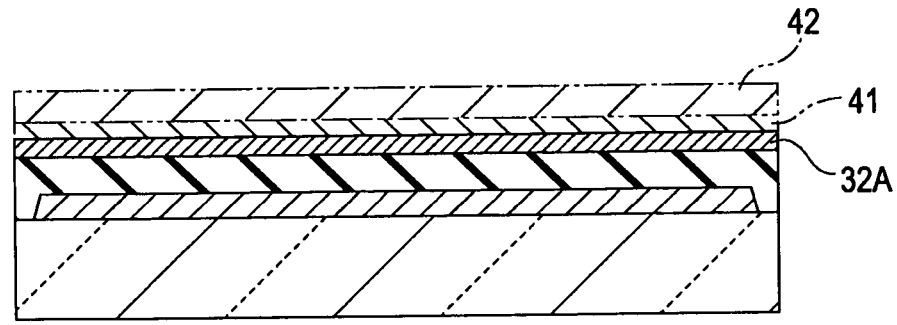

After the irradiation of the laser beam Lh is performed as described above, as shown in FIG. 5D, the photothermal conversion layer 42 and buffer layer 41 disposed on the semiconductor thin film 32A are removed by etching.

Figure 6A:
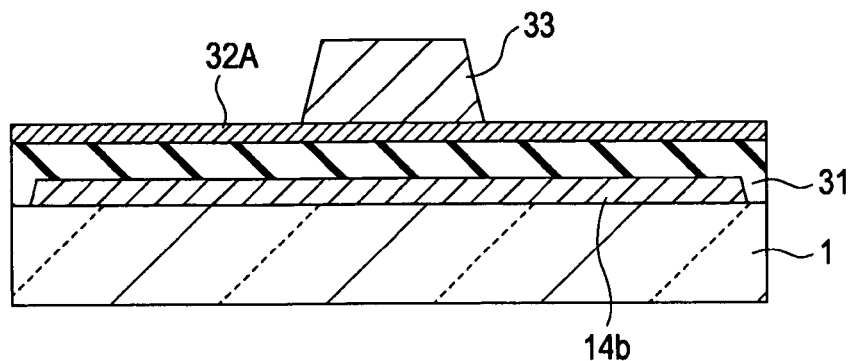
FIGS. 6A to 6D are cross-sectional views (part 2) illustrating the production process of the first embodiment.

Next, as shown in FIG. 6A, an insulating stopper layer 33 is pattern-formed on a portion of the semiconductor thin film 32A to be formed into a channel region at a position where the stopper layer 33 overlaps with the gate electrode (14a) 14b with the semiconductor thin film 32A therebetween.

Figure 6B:
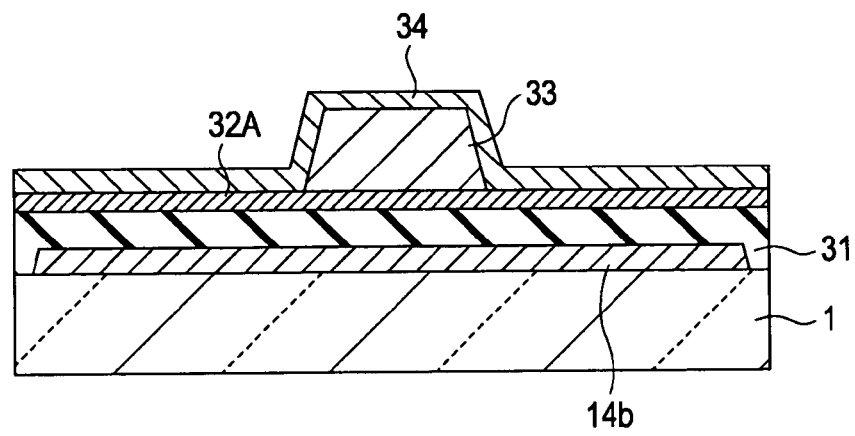

Subsequently, as shown in FIG. 6B, an n-type semiconductor layer 34 made of, for example, silicon containing an n-type impurity is deposited so as to cover the stopper layer 33.

Figure 6C:
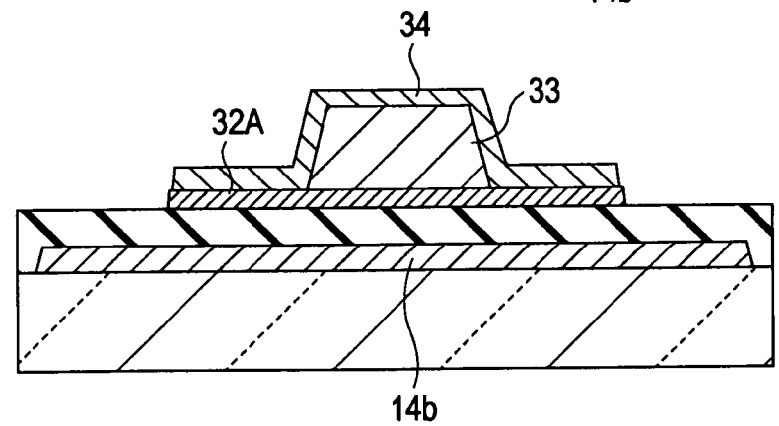

Next, as shown in FIG. 6C, the n-type semiconductor layer 34 and the semiconductor thin film 32A are patterned so as to have an island shape above the gate electrode (14a) 14b.

Figure 6D:
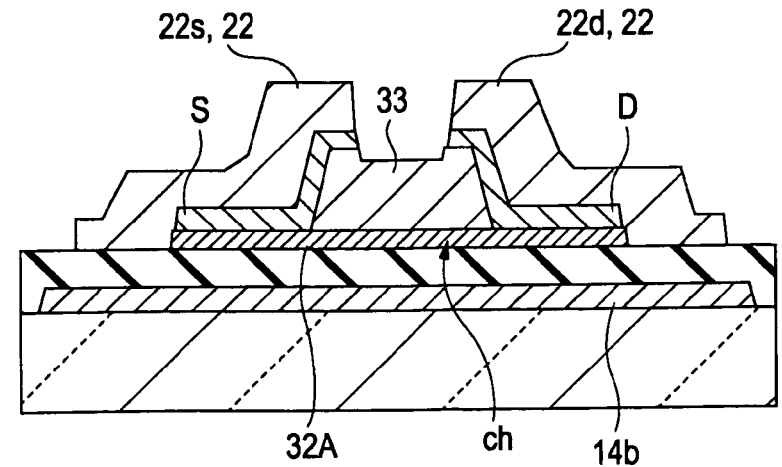

Subsequently, as shown in FIG. 6D, a metal film covering the n-type semiconductor layer 34 is formed and then patterned, thereby forming a source electrode 22s and a drain electrode 22d both of which are composed of a second metal pattern 22. The source electrode 22s and the drain electrode 22d are separately provided on the stopper layer 33. Furthermore, the n-type semiconductor layer 34 is also patterned so as to be separated on the stopper layer 33, thereby forming a source S and a drain D both of which are composed of the n-type semiconductor layer 34. Accordingly, bottom-gate thin-film transistors Tr1 and Tr2 are obtained in which a channel region ch is constituted by the microcrystalline semiconductor thin film 32A and the source electrode 22s and the drain electrode 22d are connected to the source S and the rain D, respectively, which are in contact with the channel region ch. Other wiring portions, for example, the scanning lines 11, the power lines 12, the upper electrodes of the capacitive elements Cs, and parts of the signal lines 13, all of which are shown in FIG. 2 are formed at the same time in the step of forming the source electrode 22s and the drain electrode 22d.

As a result, as shown in FIG. 2, a thin-film transistor substrate (drive substrate) in which the scanning lines 11, the power lines 12, and the signal lines 13 are arranged on each of the display areas 2a of the glass substrate 1, and pixel-driving circuits including the thin-film transistors Tr1 and Tr2 and the capacitive element Cs are provided on each of the sub-pixels a can be produced. By using the same process as the process described above, other elements and wirings constituting peripheral driving circuits (not shown) provided near the display areas are formed. As the peripheral driving circuit, for example, a signal-line-driving circuit is provided along the long-side direction x of the display area 2 and a scanning-line-driving circuit is provided along the short-side direction y of the display area 2.

Figure 7:
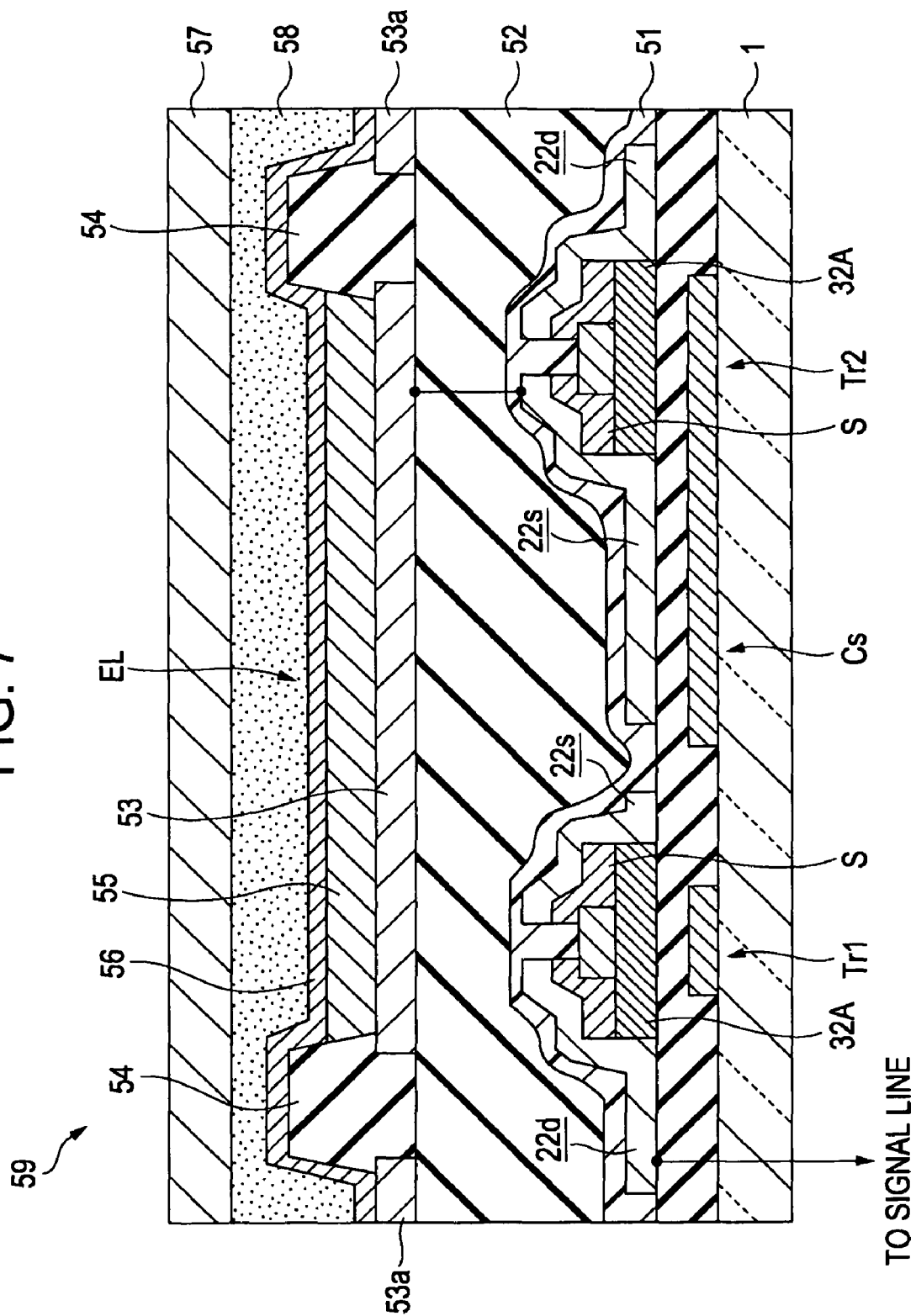
FIG. 7 is a cross-sectional view illustrating a process of producing a light-emitting element of the first embodiment.

Next, a description will be made of a step of forming light-emitting elements on the thin-film transistor substrate prepared above. FIG. 7 is a view showing a cross-sectional structure of a pixel (sub-pixel) of an active matrix organic EL display device and corresponds to the cross section taken along line VII-VII in FIG. 2.

As shown in FIG. 7, a passivation film 51 is deposited so as to cover the glass substrate 1 on which the circuit including the thin-film transistors Tr1 and Tr2 and the capacitive element Cs is formed, and a planarizing insulating film 52 is formed on the passivation film 51. A contact hole (not shown) reaching one of the source electrode 22s and the drain electrode 22d (for example, the source electrode 22s) of the driving transistor Tr2 is formed in the passivation film 51 and the planarizing insulating film 52. Next, a lower electrode 53 connected to the source electrode 22s via the contact hole is pattern-formed on the planarizing insulating film 52. This lower electrode 53 is used as an anode (or a cathode) of an organic electroluminescent element EL and pattern-formed on each pixel. An auxiliary wiring 53a having a shape insulated from the lower electrode 53 is formed at the same time in the step of forming the lower electrode 53.

Next, an insulating pattern 54 is formed so as to widely expose a central portion of the lower electrode 53 and to cover the periphery of the lower electrode 53. An opening portion of this insulating pattern 54 becomes a pixel opening. This insulating pattern 54 also includes a contact hole reaching the auxiliary wiring 53a.

Subsequently, a luminescent functional layer 55 made of an organic material is formed so as to cover the lower electrode 53 exposed in the insulating pattern 54. This luminescent functional layer 55 includes at least an organic luminescent layer. The luminescent functional layer 55 is formed by sequentially laminating, for example, from the anode side, a hole injection layer, a hole-transporting layer, the organic luminescent layer, and an electron-transporting layer, if necessary.

Next, an upper electrode 56 is formed so as to cover the luminescent functional layer 55. This upper electrode 56 is used as a cathode (or an anode) of the organic electroluminescent element EL and formed as a common electrode for all pixels. This upper electrode 56 is connected to the auxiliary wiring 53a via a contact hole provided in the insulating pattern 54.

Accordingly, the organic electroluminescent element EL in which the luminescent functional layer 55 including the organic luminescent layer is sandwiched between the lower electrode 53 and the upper electrode 56 is formed on the planarizing insulating film 52. This organic electroluminescent element EL is configured to be connected to the driving transistor Tr2 in the lower electrode 53.

Next, a sealing substrate 57 is disposed so as to face a surface of the glass substrate 1, the surface having the organic electroluminescent element EL thereon. The glass substrate 1 is bonded to the sealing substrate 57 with an adhesive sealant 58 therebetween. In the case where areas for forming a plurality of display panels 2 are defined on the single glass substrate 1 as shown in FIG. 1, the glass substrate 1 and the sealing substrate 57 are divided so that each of the display panels 2 are separated from each other.

Figure 8:
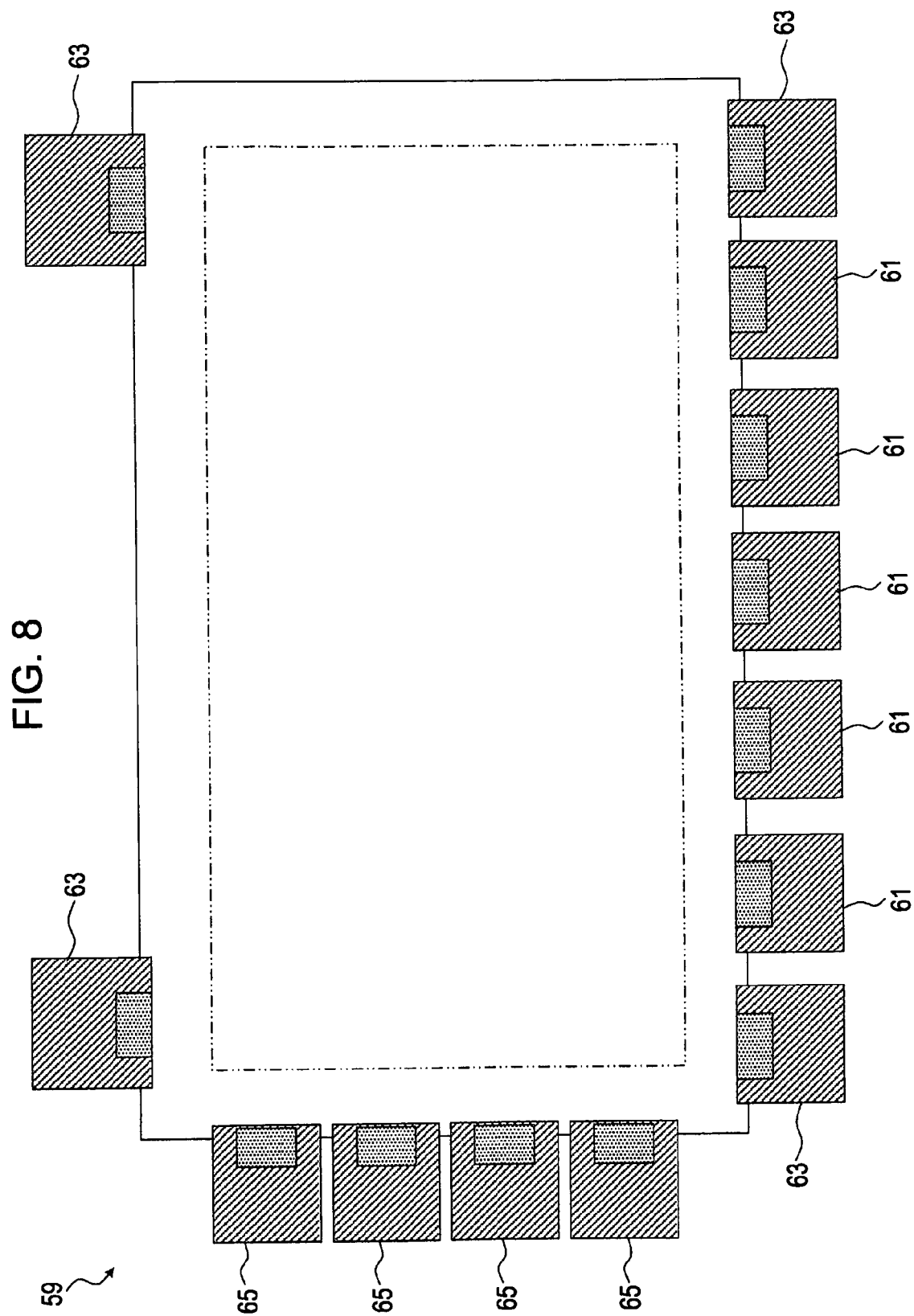
FIG. 8 is an overall view of a display device of the first embodiment.

Subsequently, as shown in FIG. 8, flexible printed circuit boards 61, 63, and 65 are connected to each of the divided portions by a predetermined procedure if necessary. These flexible printed circuit boards 61, 63, and 65 are, for example, substrates 61 for supplying picture signals, substrates 63 for supplying a power, and substrates 65 for supplying scanning signals and power control signals, respectively.

A display device 59 is produced as described above.

In the display device 59 having the above structure, in each of the sub-pixels a, a picture signal written from the signal line 13 through the switching transistor Tr1 is held in the storage capacitor Cs. A current corresponding to the amount of held signal is supplied from the driving transistor Tr2 to the organic electroluminescent element EL. The organic electroluminescent element EL emits light with a luminance corresponding to the value of this current.

According to the production method of the first embodiment, for example, as shown in FIG. 4 (see FIG. 2), in crystallization of the semiconductor thin film 32 by irradiation of the laser beam Lh, the laser beam Lh is scanned such that the scanning direction of the laser beam Lh is the same with respect to the order of arrangement (i.e., layout) of the source S and the drain D of the driving transistor Tr2. Thereby, portions of the semiconductor thin film 32 disposed above the gate electrodes 14b are constantly scanned by the laser beam Lh in a direction from the drain D side to the source S side (or in the reverse direction). Consequently, a difference in crystallinity between a portion of the semiconductor thin film 32 at the source S side and a portion of the semiconductor thin film 32 at the drain D side, the portions being disposed above the gate electrode 14b, the difference being caused by a difference in the scanning direction of the laser beam Lh, is constant in the driving transistors Tr2. Accordingly, the driving transistors Tr2 in which an on-current is uniform can be produced, thus preventing uneven luminance of the organic electroluminescent elements EL connected to the driving transistors Tr2.

In addition, the arrangement of the source S and the drain D of the driving transistor Tr2 is reversed in adjacent pixel rows (the first pixel rows A1 and the second pixel rows A2). Therefore, as described above, in order to scan the laser beam Lh so that the scanning direction of the laser beam Lh is the same with respect to the order of arrangement (i.e., layout) of the source S and the drain D of the driving transistor Tr2, scanning of the laser beam Lh is performed in the arrangement direction of the sub-pixels a in a reciprocating manner.

Consequently, the time necessary for the step of crystallization annealing of the semiconductor thin film can be reduced.

Accordingly, a display device which has satisfactory display properties and in which uneven luminance of electroluminescent elements connected to the driving transistors Tr2 is prevented can be produced within a further reduced turnaround time (TAT).

Second Embodiment

Figure 9:
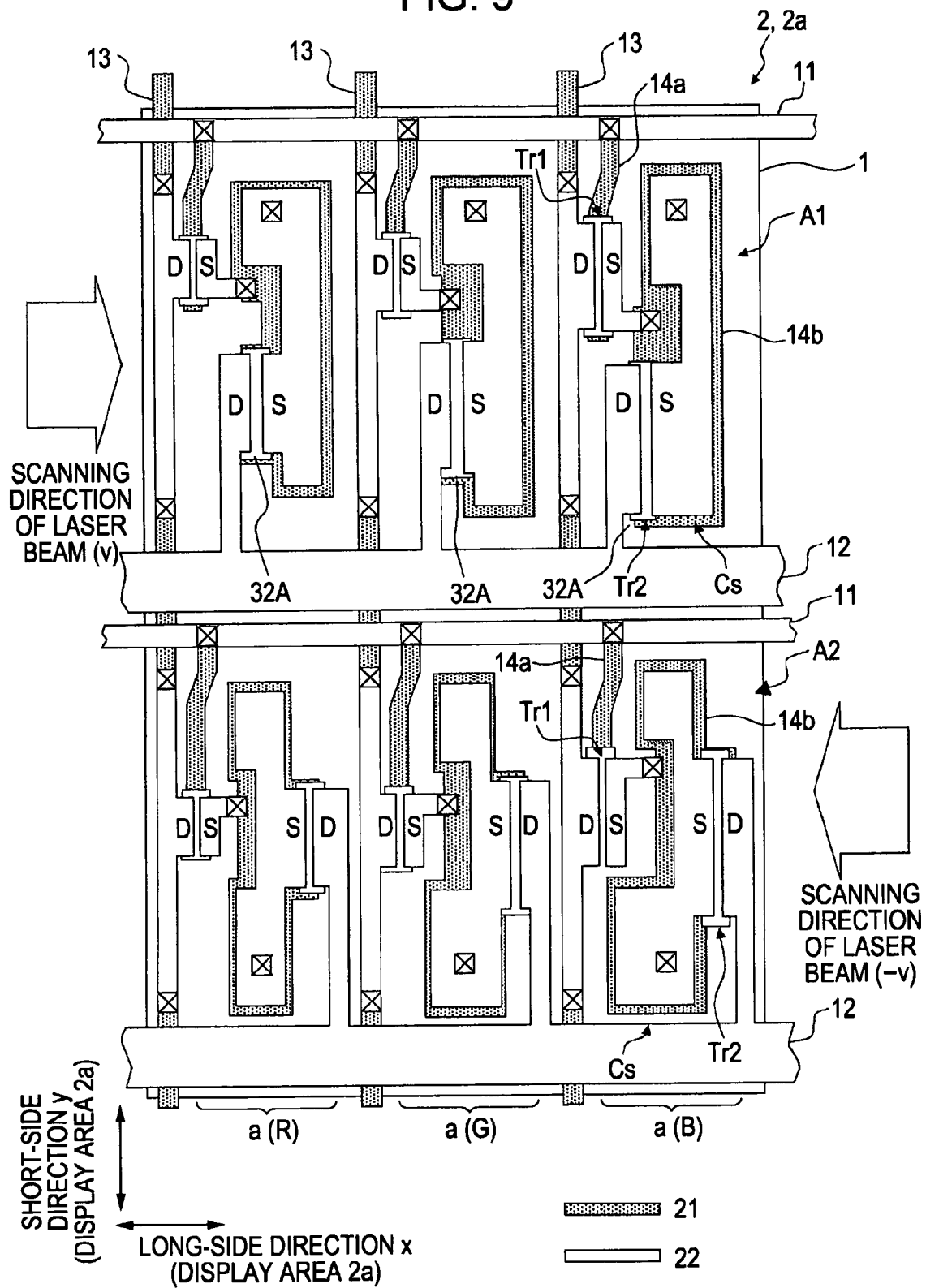
FIG. 9 is a view showing an arrangement of six pixels (sub-pixels) illustrating a feature of a second embodiment.

FIG. 9 is a view showing an arrangement illustrating a second embodiment which is a modification of the first embodiment. The second embodiment to be described with reference to this figure differs from the first embodiment in that a first pixel row A1 and a second pixel row A2 do not share a power line 12, and a scanning line 11 and a power line 12 are arranged for each of the first pixel row A1 and the second pixel row A2. The arrangement of the thin-film transistors Tr1 and Tr2 provided in each of sub-pixels a is the same as that of the first embodiment.

Specifically, the thin-film transistors Tr1 and Tr2 are arranged so that a channel length direction thereof is parallel to a short side of the sub-pixel a, that is, gate electrodes 14a and 14b extend in a long-side direction of the sub-pixel a, i.e., in a short-side direction y of the display area 2a.

Furthermore, in particular, when a row of sub-pixels a parallel to a scanning line 11 is defined as a pixel row, in each of the display areas 2a, first pixel rows A1 and second pixel rows A2 are arranged in accordance with a source S/drain D arrangement of the driving transistor Tr2. In the first pixel rows A1 and the second pixel rows A2, the source S and the drain D of the driving transistor Tr2 are reversely arranged with respect to the direction of the pixel rows. More specifically, in each of sub-pixels a in the first pixel rows A1, the drain D and the source S of the driving transistor Tr2 are arranged in that order in a first direction (for example, in a direction from the left to the right in FIG. 9). In contrast, in each of sub-pixels a in the second pixel rows A2, the drain D and the source S of the driving transistor Tr2 are arranged in that order in a second direction opposite to the first direction (for example, in a direction from the right to the left in FIG. 9).

Preferably, the first pixel rows A1 and the second pixel rows A2 are alternately arranged along the extending direction of the signal lines 13.

A thin-film transistor substrate having the above arrangement is prepared by a procedure similar to that used in the first embodiment.

Figure 10:
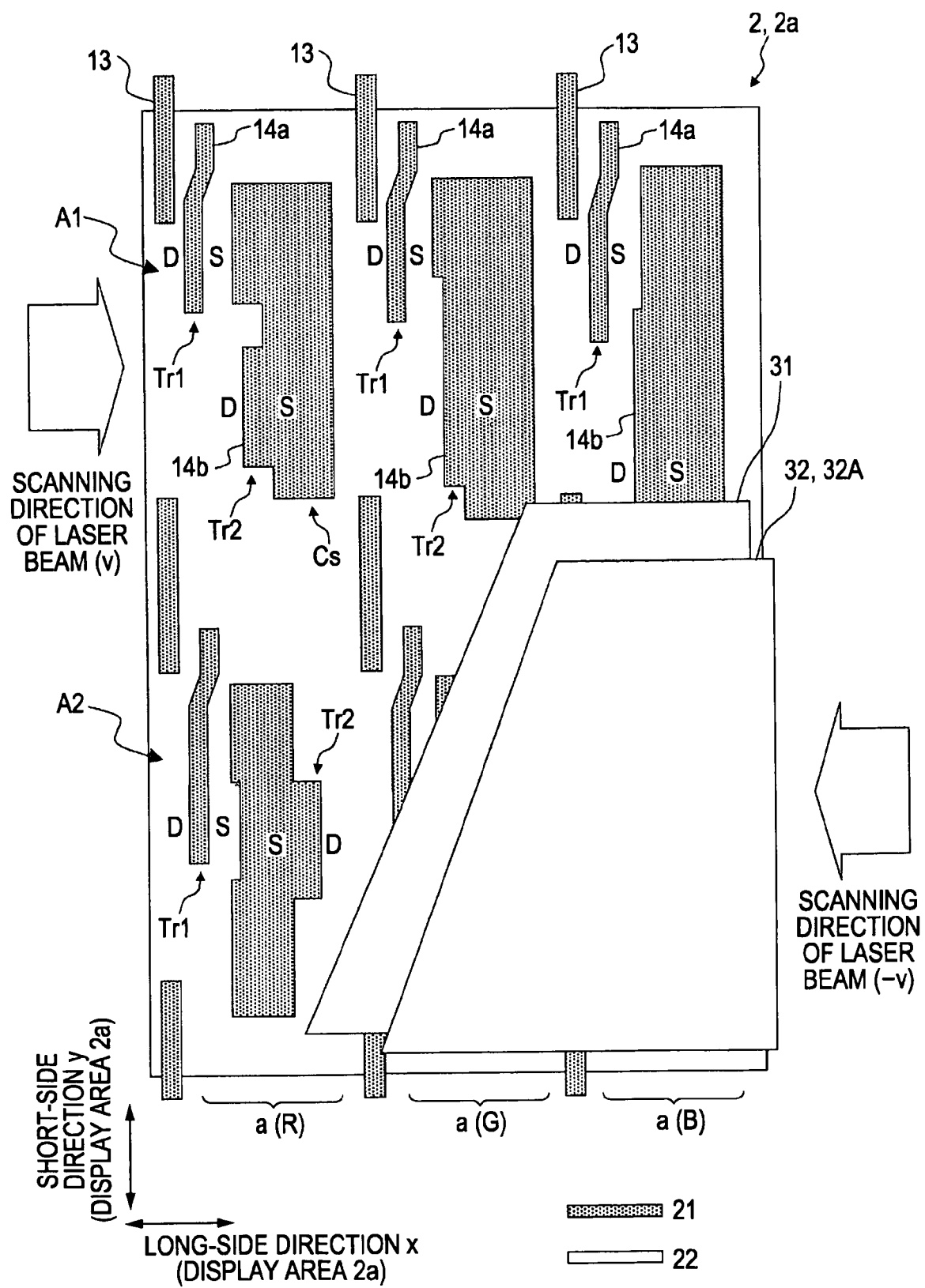
FIG. 10 is a plan view of the six pixels (sub-pixels) illustrating a step in a production process of the second embodiment.

Specifically, as shown in FIG. 10, first, by the procedure described with reference to FIG. 5A in the first embodiment, gate electrodes 14a and 14b composed of a first metal pattern 21 are formed on each of display areas 2a of a glass substrate 1, and furthermore, other wiring portions composed of the first metal pattern 21, for example, parts of signal lines 13 and lower electrodes of capacitive elements Cs, are also formed. In this step, the gate electrodes 14a of switching transistors Tr1 and the gate electrodes 14b of driving transistors Tr2 are patterned so as to extend in a direction parallel to a short-side direction y of the display area 2a. The parts of the signal lines 13 are patterned so as to extend in the direction parallel to the short-side direction y of the display area 2a.

In particular, the gate electrodes 14b of the driving transistors Tr2 are provided such that a source S/drain D arrangement in an arrangement direction of sub-pixels a is reversed every pixel row extending in a direction perpendicular to an extending direction of the signal lines 13. More specifically, in each of the display areas 2a, first pixel rows A1 and second pixel rows A2 are arranged in accordance with the source S/drain D arrangement of the driving transistors Tr2. In the first pixel rows A1 and the second pixel rows A2, the source S/drain D arrangement of the driving transistors Tr2 is reversed in the arrangement direction of the sub-pixels a. The gate electrode 14b of the driving transistor Tr2 is formed as a pattern that is continuous with the lower electrode of the capacitive element Cs. A portion constituting the gate electrode 14b in this continuous pattern is provided so as to extend in a direction parallel to the short-side direction y of the display area 2a.

Next, a gate insulating film 31 made of, for example, silicon oxide or silicon nitride is deposited so as to cover the first metal pattern 21, and a semiconductor thin film 32 made of amorphous silicon is subsequently deposited on the gate insulating film 31.

Subsequently, as shown in FIG. 5B, a buffer layer 41 made of silicon oxide or silicon nitride is deposited so as to cover the semiconductor thin film 32. Subsequently, a photothermal conversion layer 42 made of molybdenum (Mo) is deposited thereon.

Subsequently, as shown in FIG. 5C and FIG. 10, the semiconductor thin film 32 is indirectly irradiated with a laser beam Lh through the photothermal conversion layer 42 and the buffer layer 41, thus performing a heat treatment on the semiconductor thin film 32. In this step, a laser beam emitted from an oscillation source composed of a solid-state laser is irradiated as the laser beam Lh. Consequently, a portion of the semiconductor thin film 32, the portion being irradiated with the laser beam Lh, is formed into a microcrystalline silicon thin film 32A crystallized so as to have crystal grains on the nanometer order.

In the irradiation of the laser beam Lh in this step, it is important that the semiconductor thin film 32 disposed above the gate electrode 14b be irradiated with the laser beam Lh while scanning the laser beam Lh such that the scanning direction of the laser beam Lh is the same with respect to the arrangement of the source S and the drain D in a direction of a row of the sub-pixels a (i.e., here, in a direction perpendicular to the signal lines 13).

For this purpose, in this step, the scanning direction v (−v) of the laser beam Lh with respect to the arrangement direction of the sub-pixels a is reversed between the first pixel rows A1 and the second pixel rows A2. Specifically, for the first pixel rows A1, the semiconductor thin film 32 is irradiated with the laser beam Lh in a scanning direction v (−v) of the laser beam Lh. In contrast, for the second pixel rows A2, the semiconductor thin film 32 is irradiated with the laser beam Lh in a scanning direction −v (v) of the laser beam Lh. In particular, the scanning direction v (−v) of the laser beam Lh is preferably determined so that the source S side of the driving transistor Tr2 is downstream and the drain D side thereof is upstream. Accordingly, the semiconductor thin film 32 is preferably irradiated with the laser beam Lh in the scanning direction v for the first pixel rows A1 and in the scanning direction −v for the second pixel rows A2. Consequently, each of the display area 2a can be irradiated with the laser beam Lh while scanning the laser beam Lh in a long-side direction x of the display area 2a in a reciprocating manner.

In addition, the first pixel rows A1 and the second pixel rows A2 are alternately arranged along the extending direction of the signal lines 13. Therefore, in the scanning of the laser beam Lh in the reciprocating manner, it is sufficient that the laser beam Lh is moved to an adjacent pixel row at an end in the scanning direction v (−v) of the laser beam Lh, and thus a moving distance can be minimized.

An irradiation width in a direction perpendicular to the scanning direction v (−v) of the laser beam Lh is determined so as to substantially cover portions where the transistors Tr1 and Tr2 are formed. In this step, it is sufficient that only portions corresponding to positions where the thin-film transistors Tr1 and Tr2 arranged as described with reference to FIG. 9 are formed are selectively irradiated with the laser beam Lh. That is, it is sufficient that only areas including upper portions of the gate electrodes (14a) 14b are selectively irradiated with the laser beam Lh.

After the irradiation of the laser beam Lh is performed as described above, the same steps as those described in the first embodiment with reference to FIGS. 5D to 6D are performed. Thereby, the thin-film transistor substrate of the second embodiment shown in FIG. 9 can be produced. Furthermore, in the case where electroluminescent elements are formed on this thin-film transistor substrate to produce an active matrix organic EL display device, the same steps as those described in the first embodiment with reference to FIGS. 7 and 8 are performed.

According to the production method of the second embodiment, for example, as shown in FIG. 10 (see FIG. 9), in crystallization of the semiconductor thin film 32 by irradiation of the laser beam Lh, the laser beam Lh is scanned such that the scanning direction of the laser beam Lh is the same with respect to the order of arrangement (i.e., layout) of the source S and the drain D of the driving transistor Tr2. Thereby, as in the first embodiment, portions of the semiconductor thin film 32 disposed above the gate electrodes 14b are constantly scanned by the laser beam Lh in a direction from the drain D side to the source S side (or in the reverse direction). Consequently, the driving transistors Tr2 in which an on-current is uniform can be produced, thus preventing uneven luminance of the organic electroluminescent elements EL connected to the driving transistors Tr2. In addition, the arrangement of the source S and the drain D of the driving transistor Tr2 is reversed in adjacent pixel rows (the first pixel rows A1 and the second pixel rows A2). Therefore, the time necessary for the step of crystallization annealing of the semiconductor thin film can be reduced.

Accordingly, also in the arrangement of the second embodiment, as in the first embodiment described above, a display device which has satisfactory display properties and in which uneven luminance of electroluminescent elements connected to the driving transistors is prevented can be produced within a further reduced turn-around time (TAT).

Third Embodiment

Figure 11:
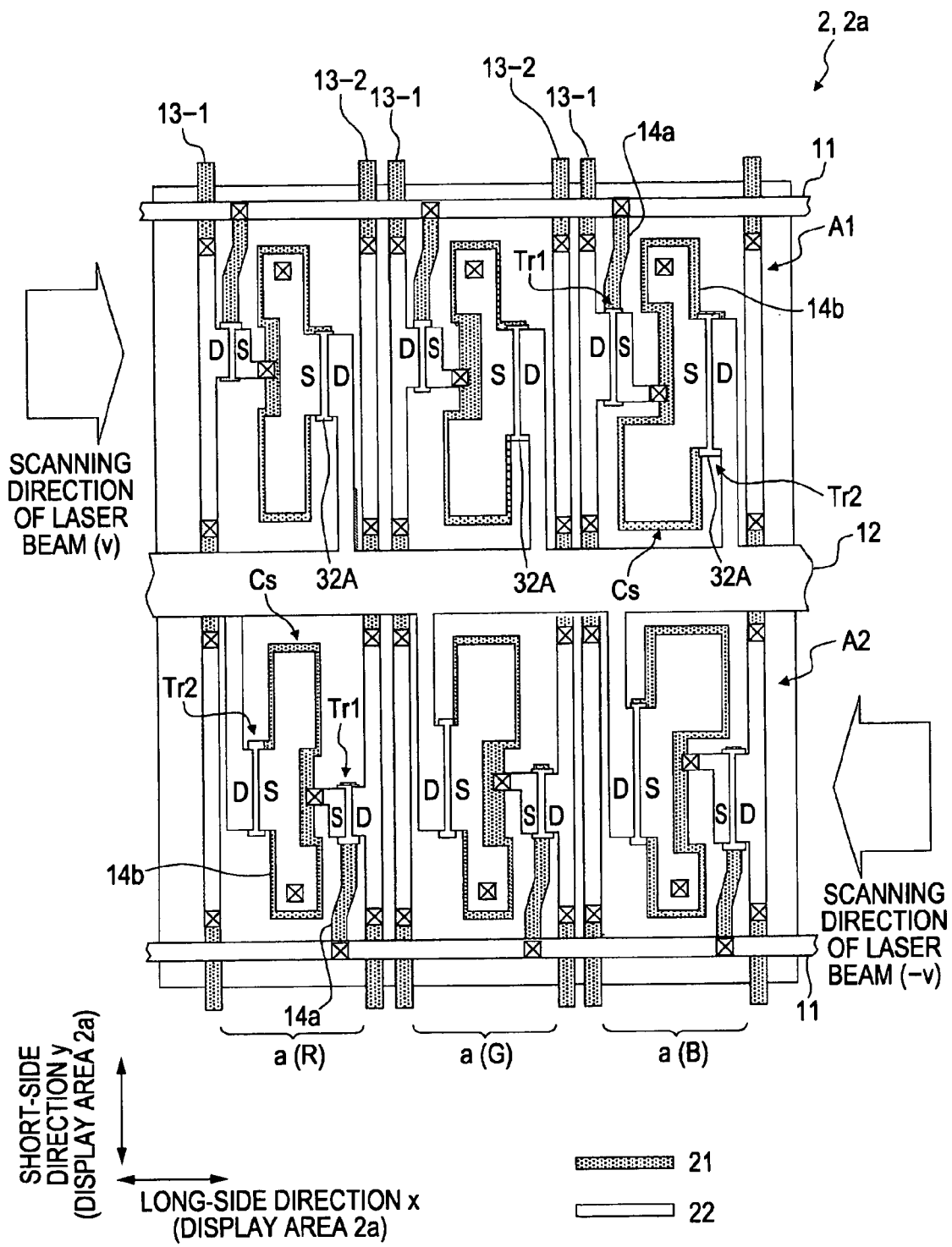
FIG. 11 is a view showing an arrangement of six pixels (sub-pixels) illustrating a feature of a third embodiment.

FIG. 11 is a view showing an arrangement illustrating a third embodiment of the present invention. The third embodiment differs from the first embodiment in that first pixel rows A1 and second pixel rows A2 are arranged in accordance with a source S/drain D arrangement of a switching transistor Tr1. Other structures are the same as the first embodiment.

In the first pixel rows A1 and the second pixel rows A2, the source S and the drain D of the switching transistor Tr1 are reversely arranged with respect to the direction of the pixel rows. More specifically, in each of sub-pixels a in the first pixel rows A1, the drain D and the source S of the switching transistor Tr1 are arranged in that order in a first direction (for example, in a direction from the left to the right in FIG. 11). In contrast, in each of sub-pixels a in the second pixel rows A2, the drain D and the source S of the switching transistor Tr1 are arranged in that order in a second direction opposite to the first direction (for example, in a direction from the right to the left in FIG. 11).

As in the first embodiment, preferably, the first pixel rows A1 and the second pixel rows A2 are alternately arranged so as to be adjacent to each other along the extending direction of signal lines 13.

In the third embodiment, also regarding driving transistors Tr2, in the first pixel rows A1 and the second pixel rows A2, the source S and the drain D of each driving transistor Tr2 are reversely arranged with respect to the direction of the pixel rows. Here, in contrast to the first embodiment, in each of sub-pixels a in the first pixel rows A1, the source S and the drain D of the driving transistor Tr2 are arranged in that order in a first direction (for example, in a direction from the left to the right in FIG. 11). In contrast, in each of sub-pixels a in the second pixel rows A2, the source S and the drain D of the driving transistor Tr2 are arranged in that order in a second direction opposite to the first direction (for example, in a direction from the right to the left in FIG. 11).

As in the first embodiment, the driving transistors Tr2 arranged in a first pixel row A1 and the driving transistors Tr2 arranged in a second pixel row A2, the first pixel row A1 and the second pixel row A2 being alternately arranged, share a power line 12.

Other structure is the same as the first embodiment.

A thin-film transistor substrate having the above arrangement is prepared by a procedure similar to that used in the first embodiment.

Figure 12:
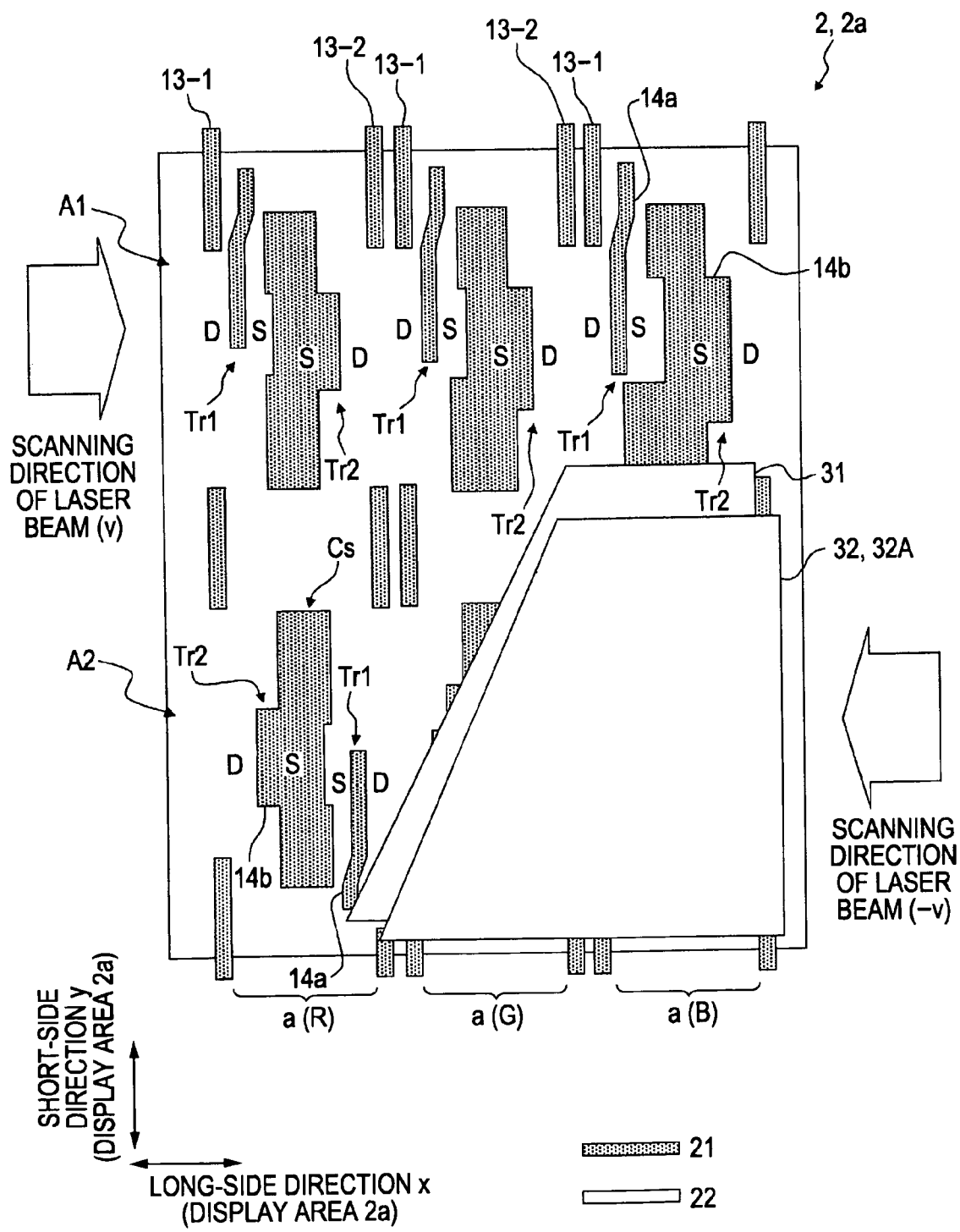
FIG. 12 is a plan view of the six pixels (sub-pixels) illustrating a step in a production process of the third embodiment.

Specifically, as shown in FIG. 12, first, by the procedure described with reference to FIG. 5A in the first embodiment, gate electrodes 14a and 14b composed of a first metal pattern 21 are formed on each of display areas 2a of a glass substrate 1, and furthermore, other wiring portions composed of the first metal pattern 21, for example, parts of signal lines 13-1 (for first pixel rows A1), parts of signal lines 13-2 (for second pixel rows A2), and lower electrodes of capacitive elements Cs, are also formed. In this step, the gate electrodes 14a of switching transistors Tr1 and the gate electrodes 14b of driving transistors Tr2 are patterned so as to extend in a direction parallel to a short-side direction y of the display area 2a. The parts of the signal lines 13-1 and 13-2 are patterned so as to extend in the direction parallel to the short-side direction y of the display area 2a.

In particular, the gate electrodes 14a of the switching transistors Tr1 are provided such that a source S/drain D arrangement in an arrangement direction of sub-pixels a is reversed every pixel row extending in a direction perpendicular to an extending direction of the signal lines 13-1 and 13-2. More specifically, in each of the display areas 2a, first pixel rows A1 and second pixel rows A2 are arranged in accordance with the source S/drain D arrangement of the switching transistors Tr1. In the first pixel rows A1 and the second pixel rows A2, the source S/drain D arrangement of the switching transistors Tr1 is reversed in the arrangement direction of the sub-pixels a.

The gate electrodes 14b of the driving transistors Tr2 are also provided such that a source S/drain D arrangement in an arrangement direction of the sub-pixels a is reversed every pixel row extending in a direction perpendicular to the extending direction of the signal lines 13-1 and 13-2. In this embodiment, in a single sub-pixel a, the source S/drain D arrangement of the switching transistor Tr1 is reverse to the source S/drain D arrangement of the driving transistor Tr2. The gate electrode 14b of the driving transistor Tr2 is formed as a pattern that is continuous with the lower electrode of the capacitive element Cs. A portion constituting the gate electrode 14b in this continuous pattern is provided so as to extend in a direction parallel to the short-side direction y of the display area 2a.

Next, a gate insulating film 31 made of, for example, silicon oxide or silicon nitride is deposited so as to cover the first metal pattern 21, and a semiconductor thin film 32 made of amorphous silicon is subsequently deposited on the gate insulating film 31.

Subsequently, as shown in FIG. 5B, a buffer layer 41 made of silicon oxide or silicon nitride is deposited so as to cover the semiconductor thin film 32. Subsequently, a photothermal conversion layer 42 made of molybdenum (Mo) is deposited on the buffer layer 41.

Subsequently, as shown in FIG. 5C and FIG. 12, the semiconductor thin film 32 is indirectly irradiated with a laser beam Lh through the photothermal conversion layer 42 and the buffer layer 41, thus performing a heat treatment on the semiconductor thin film 32. In this step, a laser beam emitted from an oscillation source composed of a solid-state laser is irradiated as the laser beam Lh. Consequently, a portion of the semiconductor thin film 32, the portion being irradiated with the laser beam Lh, is formed into a microcrystalline silicon thin film 32A crystallized so as to have crystal grains on the nanometer order.

In the irradiation of the laser beam Lh in this step, it is important that the semiconductor thin film 32 disposed above the gate electrode 14b be irradiated with the laser beam Lh while scanning the laser beam Lh such that the scanning direction of the laser beam Lh is the same with respect to the arrangement of the source S and the drain D in a direction of a row of the sub-pixels a (i.e., here, in a direction perpendicular to the signal lines 13-1 and 13-2).

For this purpose, in this step, the scanning direction v (−v) of the laser beam Lh with respect to the arrangement direction of the sub-pixels a is reversed between the first pixel rows A1 and the second pixel rows A2. Specifically, for the first pixel rows A1, the semiconductor thin film 32 is irradiated with the laser beam Lh in a scanning direction v (−v) of the laser beam Lh. In contrast, for the second pixel rows A2, the semiconductor thin film 32 is irradiated with the laser beam Lh in a scanning direction −v (v) of the laser beam Lh. In particular, the scanning direction v (−v) of the laser beam Lh is preferably determined so that the source S side of the switching transistor Tr1 is downstream and the drain D side thereof is upstream. Accordingly, the semiconductor thin film 32 is preferably irradiated with the laser beam Lh in the scanning direction v for the first pixel rows A1 and in the scanning direction −v for the second pixel rows A2. Consequently, each of the display area 2a can be irradiated with the laser beam Lh while scanning the laser beam Lh in a long-side direction x of the display area 2a in a reciprocating manner.

In addition, the first pixel rows A1 and the second pixel rows A2 are alternately arranged in the extending direction of the signal lines 13-1 and 13-2. Therefore, in the scanning of the laser beam Lh in the reciprocating manner, it is sufficient that the laser beam Lh is moved to an adjacent pixel row at an end in the scanning direction v (−v) of the laser beam Lh, and thus a moving distance can be minimized.

An irradiation width in a direction perpendicular to the scanning direction v (−v) of the laser beam Lh is determined so as to substantially cover portions where the transistors Tr1 and Tr2 are formed. In this step, it is sufficient that only portions corresponding to positions where the thin-film transistors Tr1 and Tr2 arranged as described with reference to FIG. 11 are formed are selectively irradiated with the laser beam Lh. That is, it is sufficient that only areas including upper portions of the gate electrodes (14a) 14b are selectively irradiated with the laser beam Lh.

After the irradiation of the laser beam Lh is performed as described above, the same steps as those described in the first embodiment with reference to FIGS. 5D to 6D are performed. Thereby, the thin-film transistor substrate of the third embodiment shown in FIG. 11 can be produced. Furthermore, in the case where electroluminescent elements are formed on this thin-film transistor substrate to produce an active matrix organic EL display device, the same steps as those described in the first embodiment with reference to FIGS. 7 and 8 are performed.

According to the production method of the third embodiment, for example, as shown in FIG. 12 (see FIG. 11), in crystallization of the semiconductor thin film 32 by irradiation of the laser beam Lh, the laser beam Lh is scanned such that the scanning direction of the laser beam Lh is the same with respect to the order of arrangement (i.e., layout) of the source S and the drain D of the driving transistor Tr2. Specifically, portions of the semiconductor thin film 32 disposed above the gate electrodes 14b are constantly scanned by the laser beam Lh in a direction from the source S side to the drain D side. Consequently, the driving transistors Tr2 in which an on-current is uniform can be produced, thus preventing uneven luminance of the organic electroluminescent elements EL connected to the driving transistors Tr2.

Figure 13:
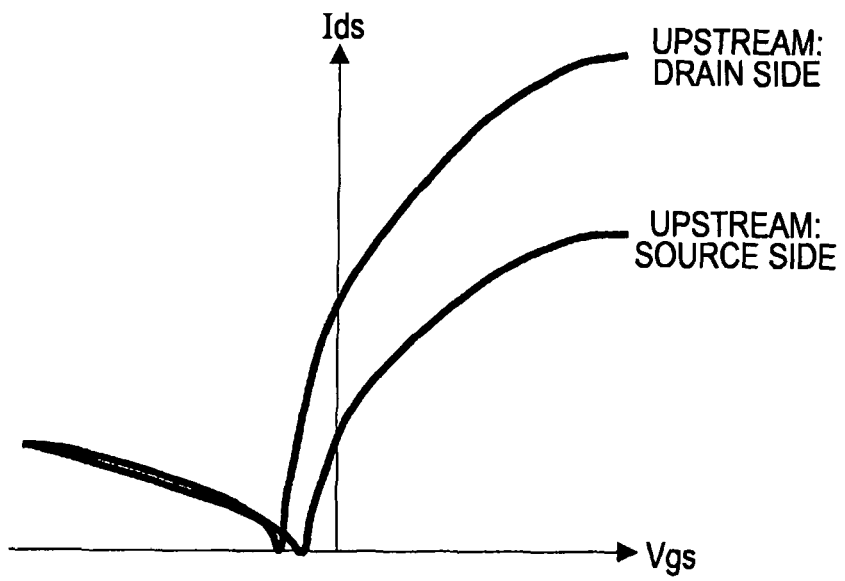
FIG. 13 is a graph showing current characteristics of thin-film transistors prepared by changing a scanning direction of a laser beam during crystallization annealing.

FIG. 13 shows current characteristics of thin-film transistors prepared by changing the scanning direction of the laser beam during the above crystallization annealing. As shown in this graph, a drain current Ids obtained was significantly different between a thin-film transistor obtained when the source side was upstream of the scanning direction and a thin-film transistor obtained when the drain side was upstream of the scanning direction. However, in this third embodiment, a laser beam is scanned in the same direction with respect to the source S/drain D arrangement of the driving transistor Tr2 in all the sub-pixels a. Therefore, uneven luminance of the organic electroluminescent elements EL connected to the driving transistors Tr2 can be prevented.

In particular, in the third embodiment, in crystallization of the semiconductor thin film 32 by the irradiation of the laser beam Lh, the arrangement of the source S and the drain D of the switching transistor Tr1 is also the same with respect to the scanning direction of the laser beam Lh in all the sub-pixels a. Accordingly, switching transistors Tr1 having uniform characteristics can be produced, and thus the organic electroluminescent elements EL can be uniformly driven by these switching transistors Tr1.

Figure 14:
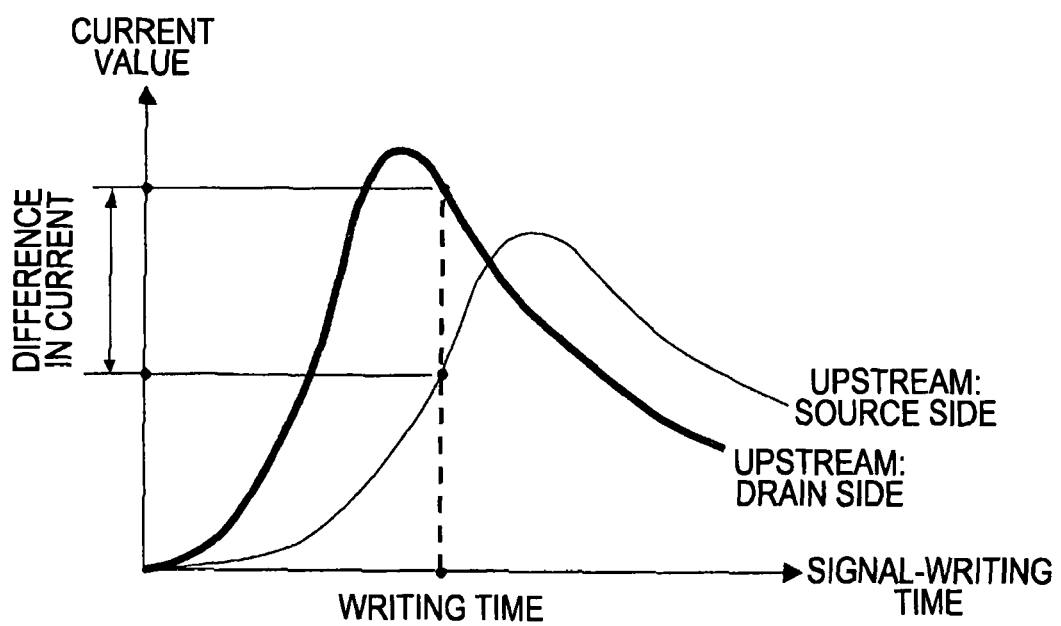
FIG. 14 is a graph showing the relationship between a signal-writing time and a current value of thin-film transistors prepared by changing a scanning direction of a laser beam during crystallization annealing.

FIG. 14 shows the relationship between a signal-writing time and a current value of thin-film transistors prepared by changing the scanning direction of the laser beam during the crystallization annealing. As shown in this graph, in a thin-film transistor obtained when the drain side was upstream of the scanning direction in the irradiation of the laser beam, a large current value could be obtained within a short signal-writing time, as compared with a thin-film transistor obtained when the source side was upstream of the scanning direction of the laser beam. Accordingly, in the third embodiment wherein the drain side of the switching transistor Tr1 is upstream of the scanning direction, the organic electroluminescent elements EL can be uniformly driven within a shorter signal-writing time.

In addition, also in the third embodiment, the arrangement of the source S and the drain D of the thin-film transistors Tr1 and Tr2 is reversed in adjacent pixel rows (the first pixel rows A1 and the second pixel rows A2). Therefore, the time necessary for the step of crystallization annealing of the semiconductor thin film can be reduced.

Accordingly, in the above-described arrangement of the third embodiment, a display device which has satisfactory display properties and in which an on-off control of electroluminescent elements can be uniformly performed by the switching transistors Tr1 and the electroluminescent elements can be driven at a uniform luminance by the driving transistors Tr2 can be produced within a further reduced turn-around time (TAT).

In the third embodiment described above, in crystallization of the semiconductor thin film 32, the switching transistors Tr1 are arranged so that the drain D is disposed at the upstream side of the scanning direction of the laser beam and the driving transistors Tr2 are arranged so that the source S is disposed at the upstream side thereof. Alternatively, in addition to the switching transistors Tr1, the driving transistors Tr2 may also be arranged so that the drain D is disposed at the upstream side. This arrangement is further preferable because electroluminescent elements connected to the driving transistors Tr2 can be driven with a larger current.

In the third embodiment, as in the second embodiment, a first pixel row A1 and a second pixel row A2 may not share a power line 12, and a scanning line 11 and a power line 12 may be arranged for each of the first pixel row A1 and the second pixel row A2. In this case, the arrangement of the thin-film transistors Tr1 and Tr2 disposed in each of the sub-pixels a may be the same as the third embodiment. This structure can also achieve the same advantage as in the third embodiment.

Fourth Embodiment

Figure 15:
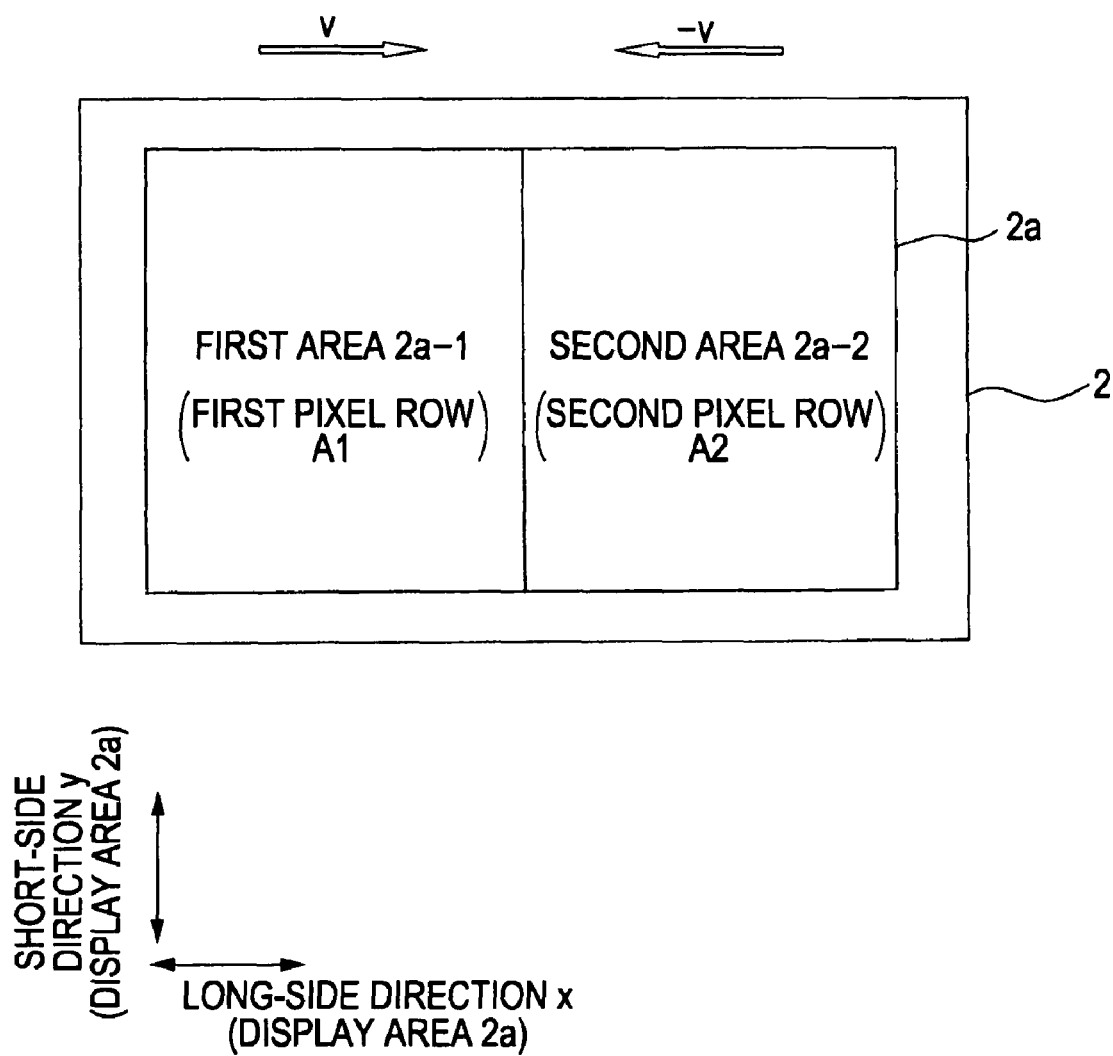
FIG. 15 is a view showing an arrangement on a substrate illustrating a fourth embodiment.

An arrangement of a thin-film transistor substrate for carrying out a production method of a fourth embodiment will now be describe with reference to FIG. 15. The fourth embodiment to be described with reference to this figure differs from the first embodiment and the second embodiment in an arrangement state of first pixel rows A1 and second pixel rows A2 described in the first embodiment and the second embodiment. In the fourth embodiment, a display area 2a is divided into two areas, i.e., a first area 2a-1 and a second area 2a-2 in a long-side direction x. A feature of the fourth embodiment is that the first pixel rows A1 are arranged in the first area 2a-1, and the second pixel rows A2 are arranged in the second area 2a-2. The structure in each of the first pixel rows A1 and the structure in each of the second pixel rows A2 may be the same as those in the first embodiment or the second embodiment.

That is, the arrangement state of sub-pixels a in the display area 2a and the structure of the pixel circuit arranged in each of the sub-pixels a may be the same as those of the first embodiment and the second embodiment. In addition, similarly, when a row of sub-pixels a parallel to the long-side direction x of the display area 2a is defined as a pixel row, in each of the display areas 2a, the first pixel rows A1 and the second pixel rows A2 are arranged in accordance with a source S/drain D arrangement of a driving transistor Tr2 or a switching transistor Tr1.

As in the first embodiment and the second embodiment, in the first pixel rows A1 and the second pixel rows A2, for example, as shown in FIG. 2 or FIG. 9, the source S and the drain D of the driving transistor Tr2 are reversely arranged with respect to the direction of the pixel rows (direction parallel to the long-side direction x of the display area 2a). More specifically, in each of sub-pixels a in the first pixel rows A1, the drain D and the source S of the driving transistor Tr2 are arranged in that order in a first direction (for example, in a direction from the left to the right in FIG. 15). In contrast, in each of sub-pixels a in the second pixel rows A2, the drain D and the source S of the driving transistor Tr2 are arranged in that order in a second direction opposite to the first direction (for example, in a direction from the right to the left in FIG. 15).

In particular, according to the feature of the fourth embodiment, such first pixel rows A1 and second pixel rows A2 are separately arranged in the first area 2a-1 and the second area 2a-2, respectively, which are formed by dividing the display area 2a into two areas in the long-side direction x.

A thin-film transistor substrate having the above arrangement can also be prepared by a procedure similar to that used in the first embodiment and the second embodiment.

In particular, when a semiconductor thin film deposited so as to cover a gate electrode is irradiated with a laser beam to perform microcrystallization, as shown in FIG. 15, the first area 2a-1 on which the first pixel rows A1 are arranged can be irradiated with a laser beam in a scanning direction v while the second area 2a-2 on which the second pixel rows A2 are arranged is irradiated with a laser beam in a scanning direction −v.

Also in the production method of the fourth embodiment, as in the first embodiment and the second embodiment, in crystallization of the semiconductor thin film by irradiation of a laser beam Lh, the laser beam Lh is scanned such that the scanning direction of the laser beam Lh is the same with respect to the order of arrangement (i.e., layout) of the source S and the drain D of the driving transistor Tr2. Thereby, as in the first embodiment and the second embodiment, portions of the semiconductor thin film 32 disposed above the gate electrodes 14b are constantly scanned by the laser beam Lh in a direction from the drain D side to the source S side (or in the reverse direction). Accordingly, the thin-film transistors Tr2 for driving in which an on-current is uniform can be produced, thus preventing uneven luminance of organic electroluminescent elements EL connected to the driving transistors Tr2. In addition, the first area 2a-1 on which the first pixel rows A1 are arranged and the second area 2a-2 on which the second pixel rows A2 are arranged are irradiated with laser beams at the same time. Consequently, the time necessary for the step of crystallization annealing of the semiconductor thin film can be reduced.

Accordingly, also in the arrangement of the fourth embodiment, as in the first embodiment and the second embodiment described above, a display device which has satisfactory display properties and in which uneven luminance of electroluminescent elements connected to the thin-film transistors is prevented can be produced within a further reduced turn-around time (TAT).

This fourth embodiment can be combined with the third embodiment. Specifically, as in the third embodiment, the first pixel rows A1 and the second pixel rows A2 may be arranged so that the source S and the drain D of the switching transistor Tr1 are reversely arranged with respect to the direction of pixel rows (direction parallel to the long-side direction x of the display area 2a), for example, as shown in FIG. 11. That is, in each of sub-pixels a in the first pixel rows A1, the drain D and the source S of the switching transistor Tr1 are arranged in that order in a first direction (for example, in a direction from the left to the right in FIG. 15). In contrast, in each of sub-pixels a in the second pixel rows A2, the drain D and the source S of the switching transistor Tr1 are arranged in that order in a second direction opposite to the first direction (for example, in a direction from the right to the left in FIG. 15).

This structure can also achieve the same advantage as in the third embodiment.

Fifth Embodiment

Figure 16:
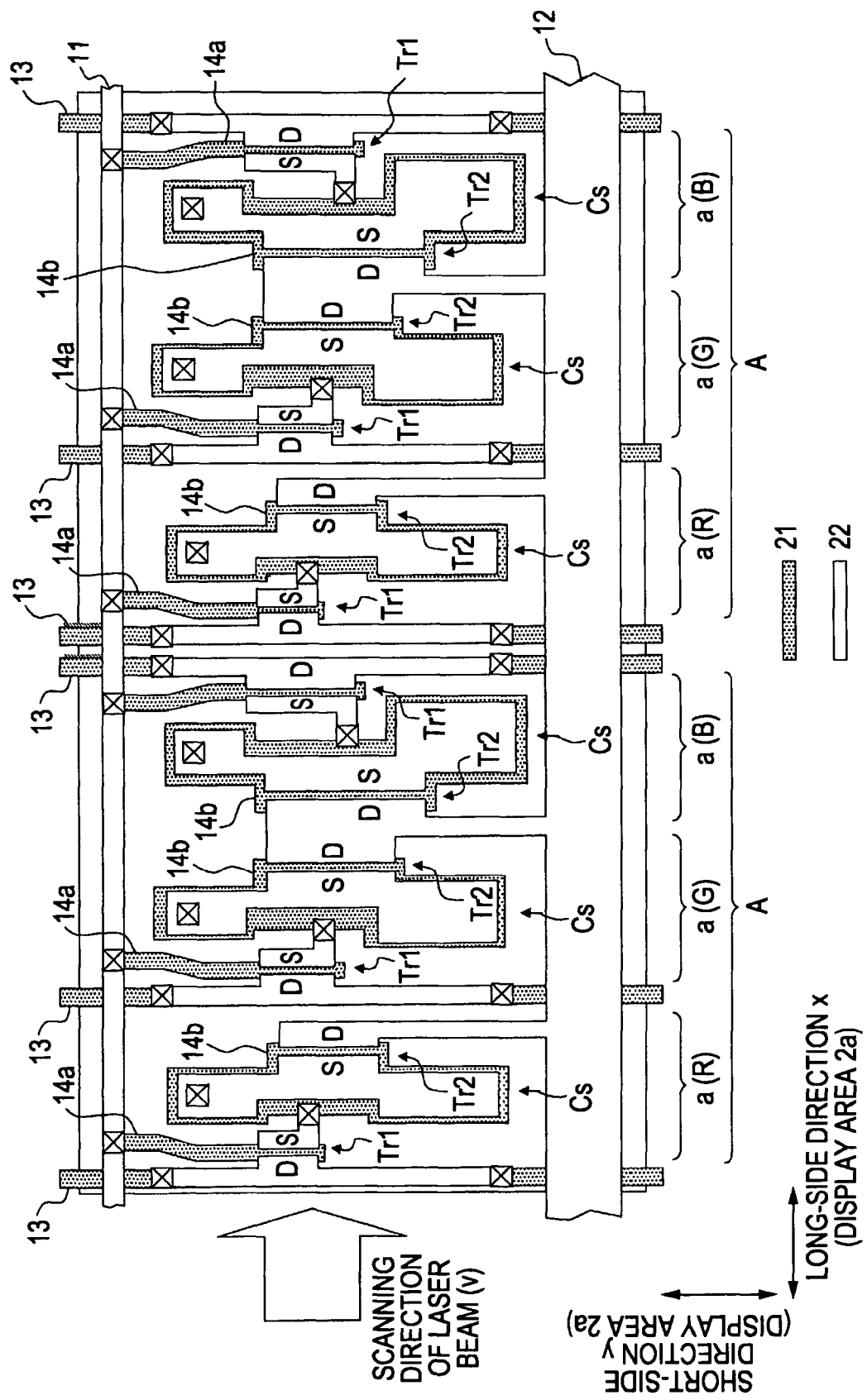
FIG. 16 is a plan view of six pixels (sub-pixels) illustrating a step in a production process of a fifth embodiment.

An arrangement of a thin-film transistor substrate for carrying out a production method of a fifth embodiment will now be describe with reference to FIG. 16. The same components as those in the first to fourth embodiments are assigned the same reference numerals and symbols, and a description of the common structure is omitted.

The fifth embodiment to be described with reference to this figure differs from the first to third embodiments in that when a row of sub-pixels a parallel to a scanning line 11 is defined as a pixel row, in a single pixel row, a source S/drain D arrangement in a bottom-gate driving transistor Tr2 is reversed in a direction of the pixel row. Other structure is the same as the first to third embodiments.

Specifically, as in the first embodiment described with reference to FIG. 1, a display area 2a is defined in each of two display panels 2 arranged on a glass substrate 1. In each of the display areas 2a, sub-pixels a each having a rectangular shape in plan view are arranged. The sub-pixels a are arranged such that a long side of each of the sub-pixels a is parallel to a short-side direction y of the display area 2a. Furthermore, these sub-pixels a constitute substantially square display pixels each composed of a set of three sub-pixels, namely, a red (R) sub-pixel a(R), a green (G) sub-pixel a(G), and a blue (B) sub-pixel a(B), the three sub-pixels a being arranged in a direction of a short side of each of the sub-pixels a.

In particular, in the fifth embodiment, among the set of the three sub-pixels a(R), a(G), and a(B) constituting a display pixel, one of the sub-pixels a is reversely arranged with respect to the pixel row direction. In this embodiment, for example, a sub-pixel including the electroluminescent element having the lowest luminous efficiency is arranged so that the source S/drain D arrangement of the sub-pixel is reversed in the pixel row direction parallel to a scanning line 11. FIG. 16 shows an example of the structure in which blue sub-pixels a(B) are reversely arranged.

Although not shown in the figure, in all the pixel rows parallel to the scanning lines 11, the blue sub-pixels a(B) are reversely arranged. In addition, a blue sub-pixel a(B) and an adjacent green sub-pixel a(G) share a power line 12 connected to drains of driving transistors Tr2.

Other structure is the same as the first embodiment. In particular, in the pixel-driving circuit described with reference to FIG. 3, each of the electroluminescent elements EL provided in the sub-pixels a(R), a(G), and a(B) emits light with a luminance in accordance with a current value of the driving transistor Tr2. Therefore, the driving transistors Tr2 provided in the sub-pixels a(R), a(G), and a(B) have channel widths that are different depending on the luminous efficiency of the electroluminescent elements EL for each color connected to the driving transistors Tr2. Specifically, in a sub-pixel including an electroluminescent element EL for a color with a low luminous efficiency, the channel width of the driving transistor Tr2 is determined to be large. In this embodiment, for example, the luminous efficiency of a blue electroluminescent element EL is the lowest and the channel width of the driving transistor Tr2 in the blue sub-pixel a(B) is the largest. The channel width of the driving transistor Tr2 in the green sub-pixel a(G) is the second largest, and the channel width of the driving transistor Tr2 in the red sub-pixel a(R) is the smallest.

A thin-film transistor substrate having the above-described arrangement is prepared by the following procedure.

Figure 17:
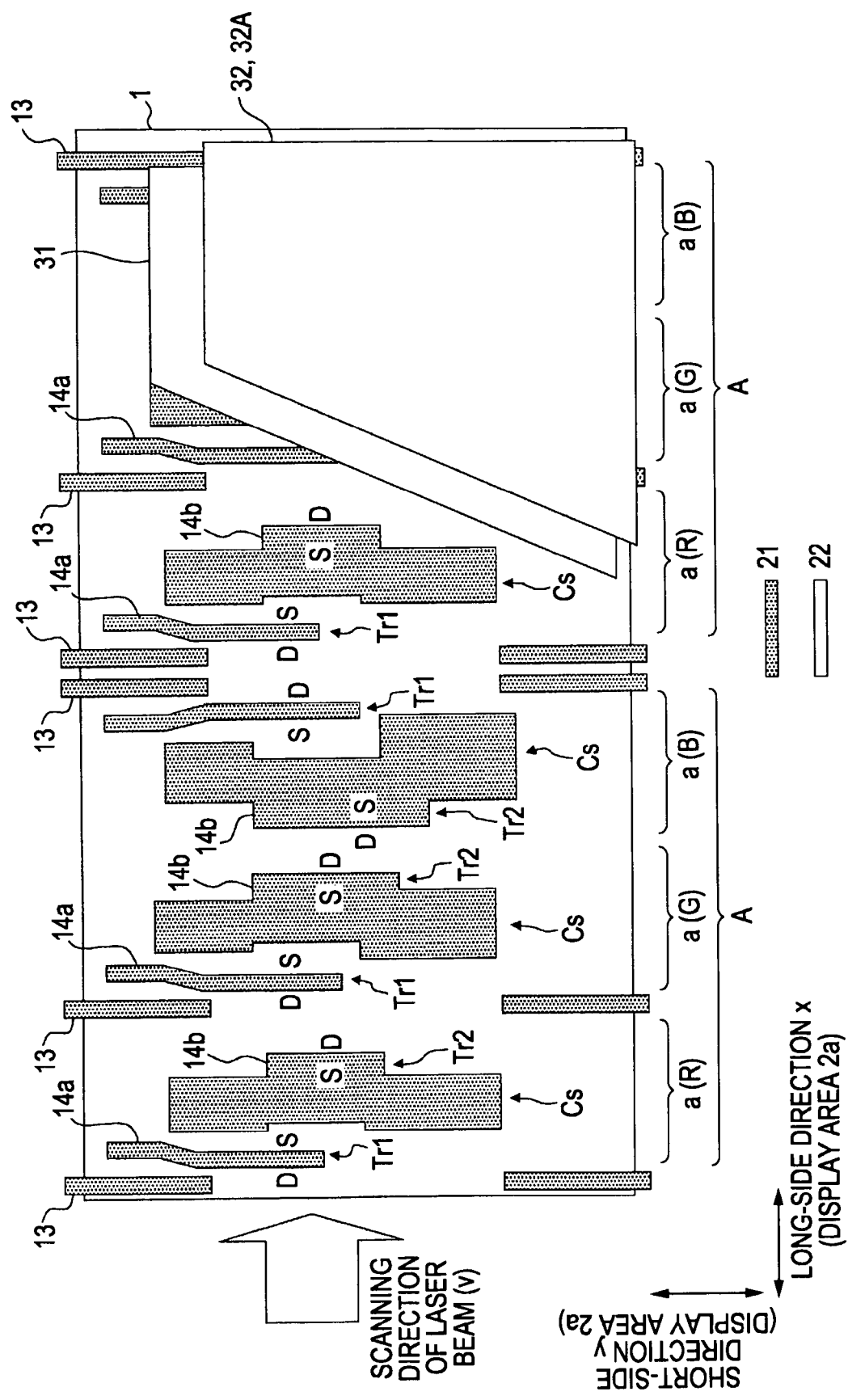
FIG. 17 is a plan view of the six pixels (sub-pixels) illustrating a step in the production process of the fifth embodiment.

First, as shown in FIG. 17, first, by the procedure described with reference to FIG. 5A in the first embodiment, gate electrodes 14a and 14b composed of a first metal pattern 21 are formed on each of display areas 2a of a glass substrate 1, and furthermore, other wiring portions composed of the first metal pattern 21, for example, parts of signal lines 13 and lower electrodes of capacitive elements Cs, are also formed.

In this step, the gate electrodes 14a of switching transistors Tr1 and the gate electrodes 14b of driving transistors Tr2 are patterned so as to extend in a direction parallel to a short-side direction y of the display area 2a. The parts of the signal lines 13 are patterned so as to extend in the direction parallel to the short-side direction y of the display area 2a.

In particular, the first metal pattern 21 is formed such that, among a set of three sub-pixels a(R), a(G), and a(B), the sub-pixel a(B) is reversely arranged with respect to the pixel row direction.

The first metal pattern 21 including the gate electrodes 14a and 14b is formed by, for example, depositing a molybdenum (Mo) film by a sputtering method, and then pattern-etching the molybdenum (Mo) film using a resist pattern as a mask. The material of the first metal pattern 21 is not limited to molybdenum (Mo) as long as the material is a refractory metal that is not readily degraded in a subsequent heating step.

Next, a gate insulating film 31 made of, for example, silicon oxide or silicon nitride is deposited so as to cover the first metal pattern 21, and a semiconductor thin film 32 made of amorphous silicon is subsequently deposited on the gate insulating film 31.

Subsequently, as shown in FIG. 5B, a buffer layer 41 made of silicon oxide or silicon nitride is deposited so as to cover the semiconductor thin film 32. Subsequently, a photothermal conversion layer 42 made of molybdenum (Mo) is deposited on the buffer layer 41. This photothermal conversion layer 42 is a layer for absorbing an energy beam such as a laser beam described below and converting light energy to heat energy. Accordingly, any material may be used as the photothermal conversion layer 42 as long as the material satisfies the conditions that, for example, the absorption rate of a laser beam (energy beam) used in crystallization annealing in the subsequent step is high, thermal diffusion rates to the buffer layer 41 and the semiconductor thin film 32 are low, and the material has a high melting point so as not to be readily degraded by heat generated in the subsequent crystallization. Alternatively, for example, carbon (C) may be used.

Subsequently, as shown in FIG. 5C and FIG. 17, the semiconductor thin film 32 is indirectly irradiated with a laser beam Lh through the photothermal conversion layer 42 and the buffer layer 41, thus performing a heat treatment on the semiconductor thin film 32. In this step, a laser beam emitted from an oscillation source composed of a solid-state laser is irradiated as the laser beam Lh. Consequently, a portion of the semiconductor thin film 32, the portion being irradiated with the laser beam Lh, is formed into a microcrystalline silicon thin film 32A crystallized so as to have crystal grains on the nanometer order.

In the irradiation of the laser beam Lh in this step, the semiconductor thin film 32 disposed above the gate electrode 14b is irradiated with the laser beam Lh while scanning the laser beam Lh such that one of the row directions of the sub-pixels a (i.e., directions along a scanning line 11 in this embodiment) is determined as a scanning direction v. In this step, for the driving transistors Tr2 of the blue sub-pixels a(B), it is preferable that the laser beam Lh be scanned in the scanning direction v in which the drain D of the driving transistors Tr2 is the upstream side.

An irradiation width in a direction perpendicular to the scanning direction v of the laser beam Lh is determined so as to substantially cover portions where the transistors Tr1 and Tr2 are formed. In this step, it is sufficient that only portions corresponding to positions where the thin-film transistors Tr1 and Tr2 arranged as described with reference to FIG. 16 are formed are selectively irradiated with the laser beam Lh. That is, it is sufficient that only areas including upper portions of the gate electrodes (14a) 14b are selectively irradiated with the laser beam Lh.

After the irradiation of the laser beam Lh is performed as described above, the same steps as those described in the first embodiment with reference to FIGS. 5D to 6D are performed. Thereby, the thin-film transistor substrate of the fifth embodiment shown in FIG. 16 can be produced. Furthermore, in the case where electroluminescent elements are formed on this thin-film transistor substrate to produce an active matrix organic EL display device, the same steps as those described in the first embodiment with reference to FIGS. 7 and 8 are performed.

According to the above-described production method of the fifth embodiment, among a set of three sub-pixels a(R), a(G), and a(B) constituting a display pixel, the sub-pixel a(B) is reversely arranged with respect to the pixel row direction, and the two sub-pixels a(G) and a(B) share a power line 12. Accordingly, the space in the sub-pixels a can be saved, and thus the distance between wirings can be increased. Consequently, the yield can be increased by an effect of preventing short-circuit.

In addition, in crystallization of the semiconductor thin film 32 by the irradiation of a laser beam Lh, the semiconductor thin film 32 is irradiated with the laser beam Lh in the single scanning direction v parallel to the pixel row. Accordingly, the semiconductor thin film 32 is constantly scanned by the laser beam Lh in a direction from the drain D side to the source S side (or in the reverse direction) for each of the sub-pixels a(R), a(G), and a(B). Therefore, thin-film transistors Tr1 and Tr2 in which an on-current is uniform in each of the sub-pixels a(R), a(G), and a(B) can be obtained. As a result, a display device which has satisfactory display properties and in which uneven luminance of electroluminescent elements EL connected to pixel circuits including the thin-film transistors Tr1 and Tr2 is prevented in each of the luminescent colors can be produced.

In particular, in the fifth embodiment, among the three sub-pixels a(R), a(G), and a(B), a sub-pixel a including the electroluminescent element EL having the lowest luminous efficiency (blue sub-pixel a(B) in this embodiment) is selected as the sub-pixel a that is reversely arranged. In addition, in crystallization of the semiconductor thin film, portions of the driving transistors Tr2 of the blue sub-pixels a(B) are scanned by the laser beam Lh in a scanning direction v in which the drain D is the upstream side. Thereby, the driving transistors Tr2 for the blue sub-pixels a(B) can provide a large drain current compared with the driving transistors Tr2 of the red sub-pixels a(R) and the green sub-pixels a(G). This is apparent from the description in the third embodiment with reference to FIG. 13.

Accordingly, a blue electroluminescent element EL with a low luminous efficiency provided in a blue sub-pixel a(B) can be driven with a larger current. In the blue sub-pixel a(B), the largest channel width is necessary for the driving transistor Tr2 compared with sub-pixels for other colors. However, since the driving current of the blue sub-pixel a(B) can be increased as described above, the channel width can be decreased accordingly. Thereby, the area occupied by the driving transistor Tr2 of the blue sub-pixel a(B) can be decreased.

Application Examples

The display devices produced by the above-described methods according to embodiments of the present invention can be used as display devices of various types of electronic devices shown in FIGS. 18 to 22, for example, a digital camera, a notebook personal computer, a mobile terminal device such as a mobile phone, and a video camera. The display devices display picture signals input to the electronic devices or picture signals generated in the electronic devices as an image or a picture. Examples of the electronic devices to which an embodiment of the present invention is applied will now be described.

Figure 18:
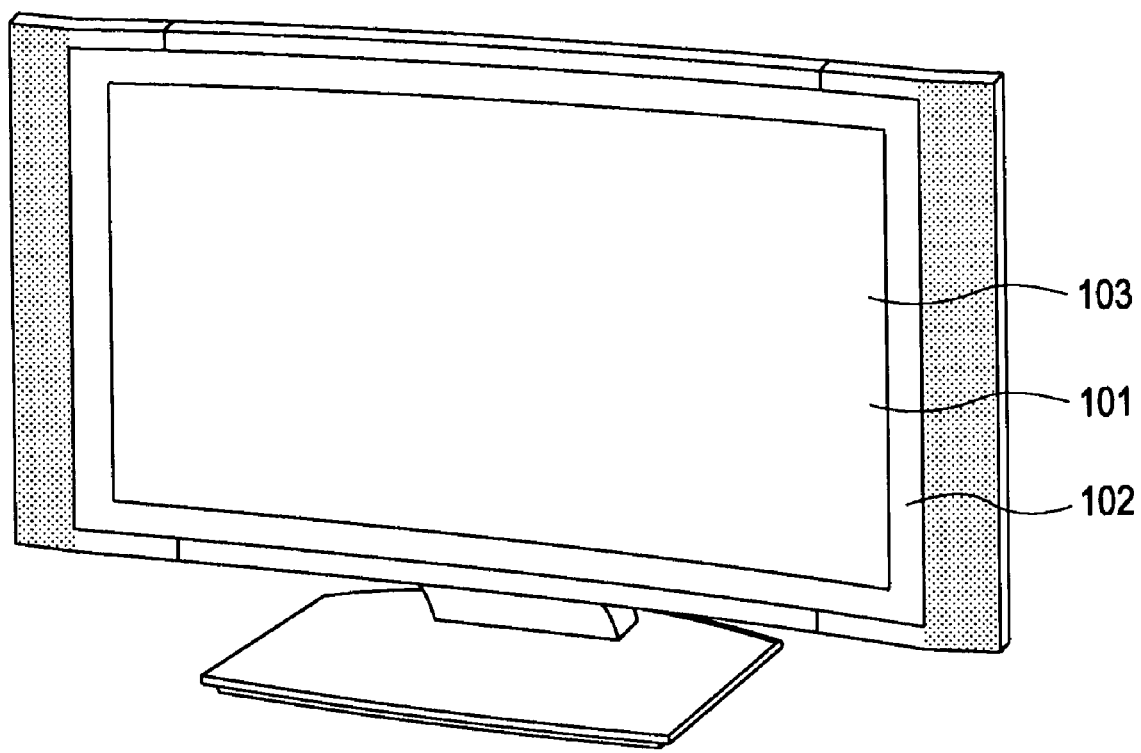
FIG. 18 is a perspective view showing a television to which an embodiment of the present invention is applied.

FIG. 18 is a perspective view showing a television to which an embodiment of the present invention is applied. The television according to this application example includes a picture display screen portion 101 composed of a front panel 102, a filter glass 103, and the like. The television is produced by using the display device according an embodiment of the present invention as the picture display screen portion 101.

Figure 19A:
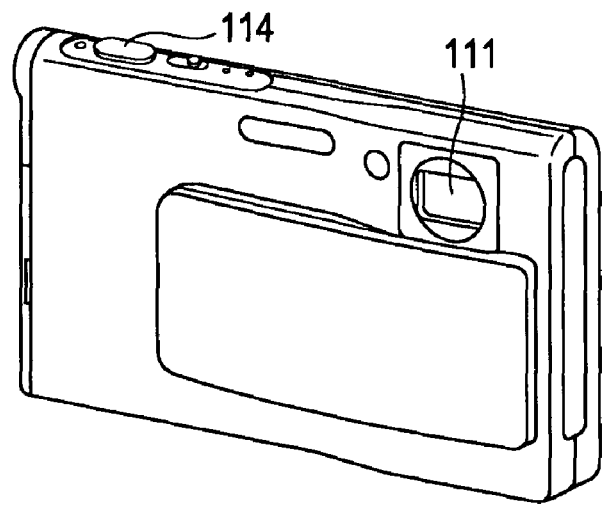
FIGS. 19A and 19B are perspective views showing a digital camera to which an embodiment of the present invention is applied.
Figure 19B:
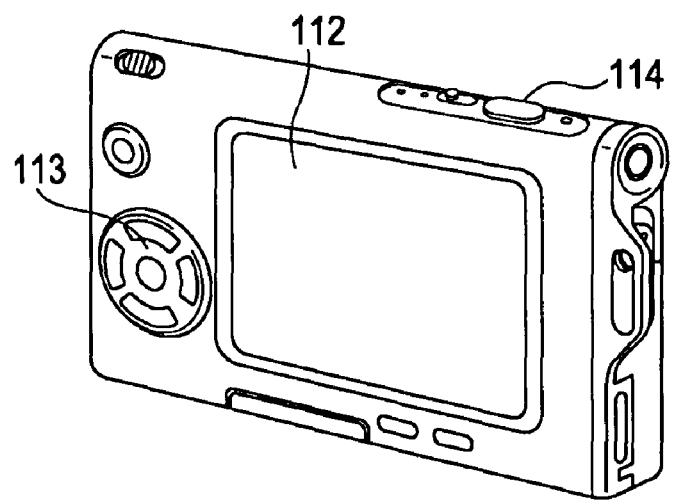

FIGS. 19A and 19B show a digital camera to which an embodiment of the present invention is applied. FIG. 19A is a perspective view, viewed from the front side. FIG. 19B is a perspective view, viewed from the reverse side. The digital camera according to this application example includes a light-emitting portion 111 for a flash, a display portion 112, a menu switch 113, a shutter bottom 114, and the like. The digital camera is produced by using the display device according an embodiment of the present invention as the display portion 112.

Figure 20:
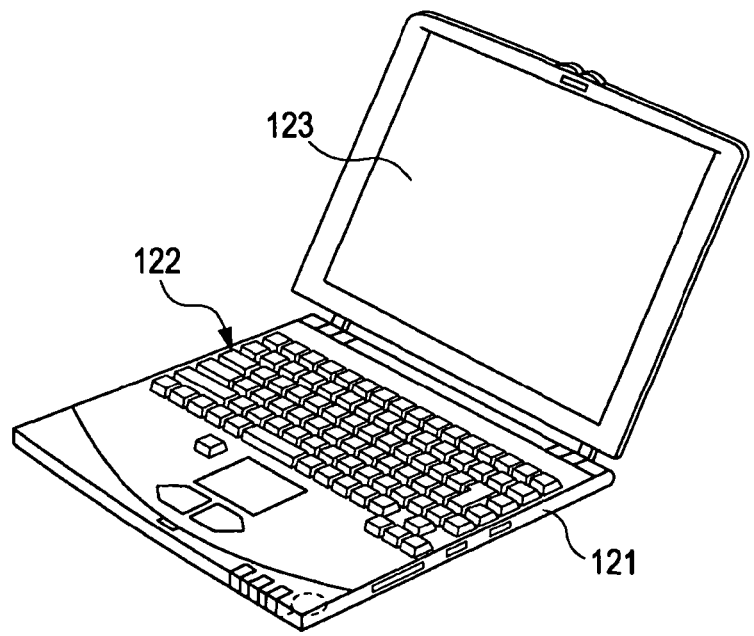
FIG. 20 is a perspective view showing a notebook personal computer to which an embodiment of the present invention is applied.

FIG. 20 is a perspective view showing a notebook personal computer to which an embodiment of the present invention is applied. The notebook personal computer according to this application example includes a body 121, a keyboard 122 used for inputting characters and the like, a display portion 123 for displaying an image, and the like. The notebook personal computer is produced by using the display device according an embodiment of the present invention as the display portion 123.

Figure 21:
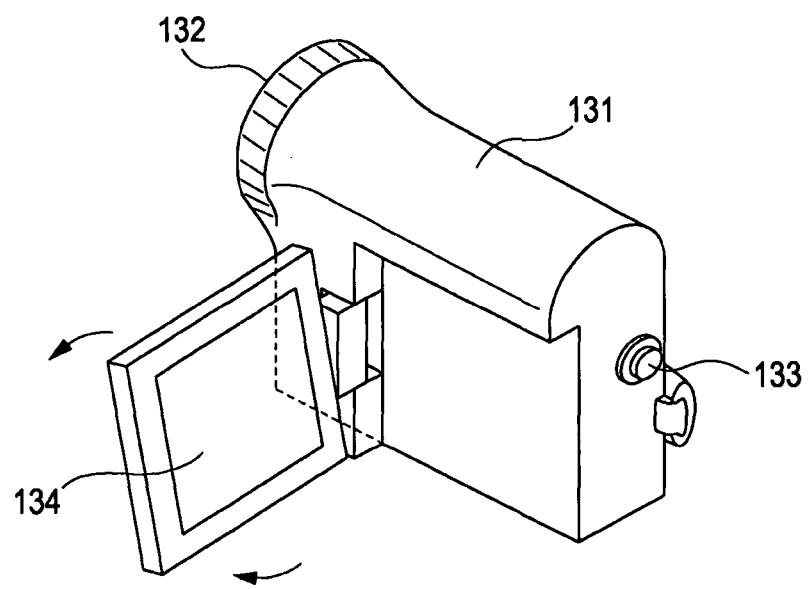
FIG. 21 is a perspective view showing a video camera to which an embodiment of the present invention is applied.
Figure 23:
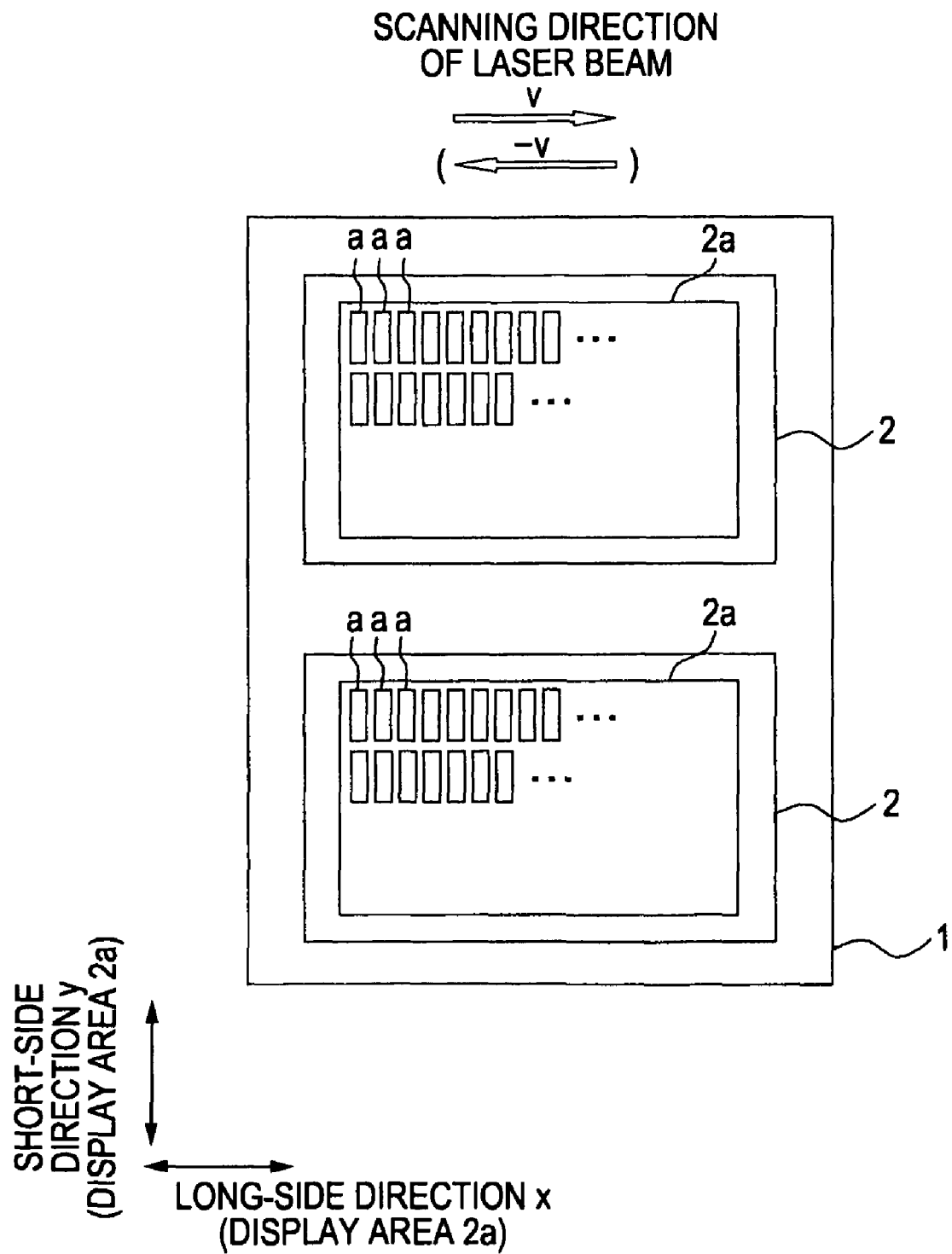
FIG. 23 is a view showing an arrangement on a thin-film transistor substrate illustrating a step of crystallization annealing in producing a display device in the related art.
Figure 26A:
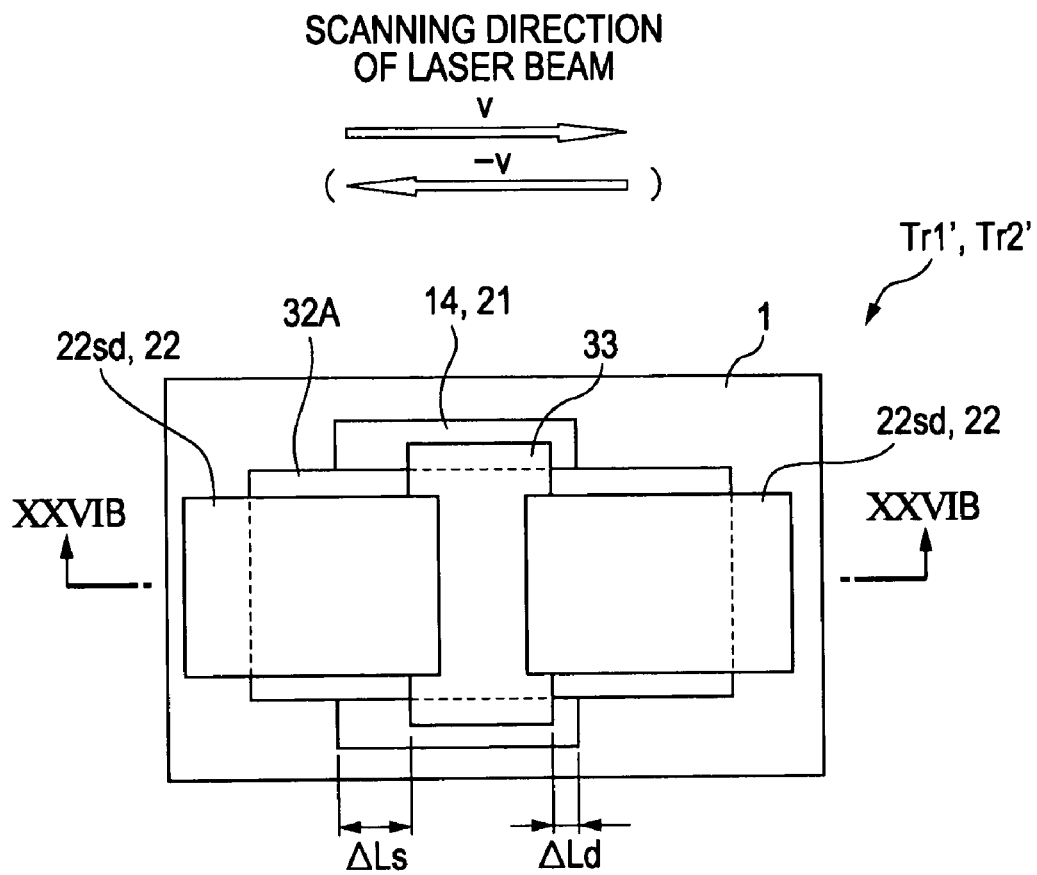
FIGS. 26A and 26B are views illustrating the process of producing the display device in the related art.
Figure 26B:
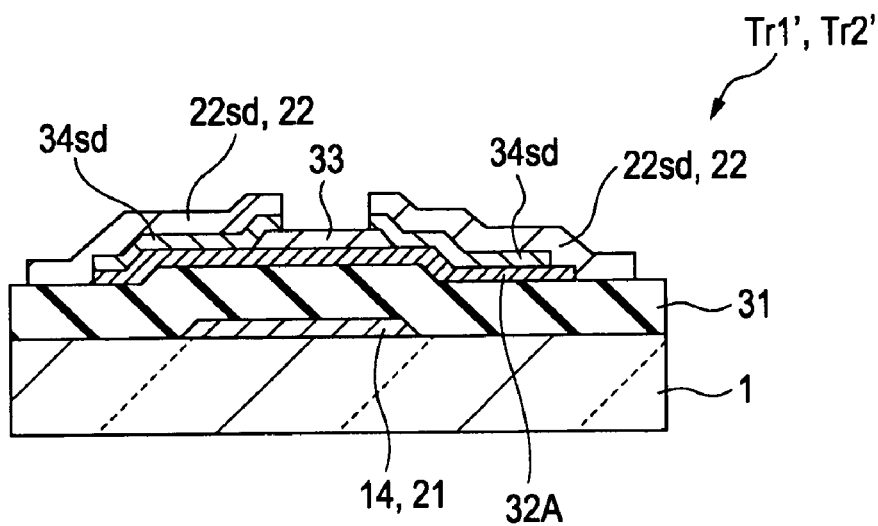

FIG. 21 is a perspective view showing a video camera to which an embodiment of the present invention is applied. The video camera according to this application example includes a body 131, a lens 132 for capturing an image of an object, the lens 132 being provided on a side face directing to the front, a start/stop switch 133 used for image capturing, a display portion 134, and the like. The video camera is produced by using the display device according an embodiment of the present invention as the display portion 134.

FIGS. 22A to 22G are views showing a mobile terminal device, e.g., a mobile phone, to which an embodiment of the present invention is applied. FIG. 22A is a front view showing a state in which the mobile phone is opened, and FIG. 22B is a side view of FIG. 22A. FIG. 22C is a front view showing a state in which the mobile phone is closed, FIG. 22D is a left side view of FIG. 22C, FIG. 22E is a right side view of FIG. 22C, FIG. 22F is a top view of FIG. 22C, and FIG. 22G is a bottom view of FIG. 22C. The mobile phone according to this application example includes an upper casing 141, a lower casing 142, a connecting portion (hinge portion in this example) 143, a display 144, a sub-display 145, a picture light 146, a camera 147, and the like. The mobile phone is produced by using the display device according an embodiment of the present invention as the display 144 or the sub-display 145.

The present application contains subject matter related to that disclosed in Japanese Priority Patent Application JP 2008-323361 filed in the Japan Patent Office on Dec. 19, 2008 and Japanese Priority Patent Application JP 2008-077400 filed in the Japan Patent Office on Mar. 25, 2008, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of producing a display device comprising:
    forming gate electrodes on a substrate so that an arrangement of a source and a drain, in a pixel row direction, of a thin-film transistor formed in each pixel of a set of pixels on the substrate is reversed every pixel row;
    forming in order a gate insulating film and an amorphous semiconductor thin film on the substrate to cover the gate electrodes;
    crystallizing the amorphous semiconductor thin film by irradiating the amorphous semiconductor thin film with an energy beam so that a scanning direction of the energy beam is the same with respect to the arrangement of the source and the drain, in the pixel row direction, of the thin-film transistor formed in each pixel of the set of pixels; and
    forming a light-emitting element connected to the thin-film transistor.

2. The method according to claim 1, wherein the energy beam is scanned in the pixel row direction in a reciprocating manner.

3. The method according to claim 1, wherein a source side is downstream of the scanning direction of the energy beam with respect to the arrangement of the source and the drain, and a drain side is upstream thereof.

4. The method according to claim 1, wherein the arrangement is reversed between adjacent pixel rows among the pixel rows.

5. The method according to claim 1, wherein, among thin-film transistors provided in each of the pixels, at least one of a thin-film transistor for switching connected to a scanning line and a signal line provided on the substrate and a thin-film transistor for driving in which a source or a drain is connected to the light-emitting element is formed so that the arrangement of the source and the drain in the pixel row direction is reversed every pixel row.

6. The method according to claim 1, further comprising:
    forming a power line between two pixel rows in which the arrangement is reversed, the power line being shared by the two pixel rows.

7. The method according to claim 1, wherein the gate electrodes are made of molybdenum.

8. The method according to claim 1, wherein the energy beam is a laser beam emitted from a solid-state laser.

9. A method of producing a thin-film transistor substrate comprising:
    forming gate electrodes on a substrate so that an arrangement of a source and a drain, in a row direction, of each of a set of thin-film transistors arranged on the substrate is reversed every row;
    forming in order a gate insulating film and an amorphous semiconductor thin film on the substrate to cover the gate electrodes; and
    crystallizing the amorphous semiconductor thin film by irradiating the amorphous semiconductor thin film disposed above the gate electrodes with an energy beam while scanning so that a scanning direction of the energy beam is the same with respect to the arrangement of the source and the drain, in the row direction, of each of the set of thin-film transistors.

* * * * *